(12) United States Patent
Uozumi et al.

(10) Patent No.: US 11,921,428 B2
(45) Date of Patent: *Mar. 5, 2024

(54) SUBSTRATE PROCESSING METHOD AND SUBSTRATE PROCESSING APPARATUS

(71) Applicant: KIOXIA CORPORATION, Tokyo (JP)

(72) Inventors: Yoshihiro Uozumi, Aichi-ken (JP); Shinsuke Kimura, Mie-ken (JP); Yoshihiro Ogawa, Mie-ken (JP); Hiroyasu Iimori, Mie-ken (JP); Tatsuhiko Koide, Mie-ken (JP); Hideaki Hirabayashi, Kanagawa-ken (JP); Yuji Nagashima, Kanagawa-ken (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/680,396

(22) Filed: Feb. 25, 2022

(65) Prior Publication Data
US 2022/0181171 A1 Jun. 9, 2022

Related U.S. Application Data

(60) Continuation of application No. 16/357,151, filed on Mar. 18, 2019, now abandoned, which is a division of
(Continued)

(30) Foreign Application Priority Data

Jul. 5, 2011 (JP) .................................. 2011-149367

(51) Int. Cl.
G03F 7/40 (2006.01)
G03F 7/16 (2006.01)
(Continued)

(52) U.S. Cl.
CPC .............. G03F 7/405 (2013.01); G03F 7/162 (2013.01); H01L 21/67017 (2013.01);
(Continued)

(58) Field of Classification Search
None
See application file for complete search history.

(56) References Cited

U.S. PATENT DOCUMENTS 6,033,134 A 3/2000 Maruyama et al.
6,417,047 B1 7/2002 Isobe
(Continued)

FOREIGN PATENT DOCUMENTS

| JP | S63231446 | * | 9/1988 | ............... G03F 7/20 |
| JP | H06224116 | * | 8/1994 | ............... G03F 7/26 |

(Continued)

OTHER PUBLICATIONS

Notification of Reasons for Refusal mailed by the Japanese Patent Office dated Jun. 16, 2014, in JP Application No. 2011-149367 and its English translation.

Primary Examiner — Jiong-Ping Lu
(74) Attorney, Agent, or Firm — Finnegan, Henderson, Farabow, Garrett & Dunner, LLP

(57) ABSTRACT

According to one embodiment, a substrate processing method is disclosed. The method can include treating a substrate with a first liquid. The substrate has a structural body formed on a major surface of the substrate. The method can include forming a support member supporting the structural body by bringing a second liquid into contact with the substrate wetted by the first liquid, and changing at least a portion of the second liquid into a solid by carrying out at least one of causing the second liquid to react, reducing a quantity of a solvent included in the second liquid, and causing at least a portion of a substance dissolved in the
(Continued)

second liquid to be separated. The method can include removing the support member by changing at least a part of the support member from a solid phase to a gaseous phase, without passing through a liquid phase.

6 Claims, 15 Drawing Sheets

Related U.S. Application Data application No. 14/940,186, filed on Nov. 13, 2015, now abandoned, which is a division of application No. 13/541,167, filed on Jul. 3, 2012, now Pat. No. 9,213,242.

(51) Int. Cl.
 *H01L 21/67* (2006.01)
 *H01L 21/677* (2006.01)
 *H01L 21/68* (2006.01)

(52) U.S. Cl.
 CPC .. *H01L 21/67028* (2013.01); *H01L 21/67051* (2013.01); *H01L 21/67075* (2013.01); *H01L 21/67098* (2013.01); *H01L 21/6715* (2013.01); *H01L 21/67739* (2013.01); *H01L 21/68* (2013.01)

(56) References Cited

U.S. PATENT DOCUMENTS

| | | | |
|---|---|---|---|
| 7,700,404 B2 | 4/2010 | Punzalan et al. | |
| 7,700,494 B2 | 4/2010 | Balasubramaniam et al. | |
| 2003/0080082 A1 | 5/2003 | Chinn et al. | |
| 2005/0230258 A1 | 10/2005 | DiMeo et al. | |
| 2006/0172225 A1* | 8/2006 | Mintz | G03F 7/0048 430/270.1 |
| 2008/0223825 A1* | 9/2008 | Onishi | H01L 21/67126 156/345.37 |
| 2008/0295868 A1* | 12/2008 | Nakamura | H01L 21/67051 134/28 |
| 2010/0146813 A1 | 6/2010 | Jeong et al. | |
| 2011/0269309 A1 | 11/2011 | Hong et al. | |
| 2011/0297192 A1 | 12/2011 | Ogata | |
| 2012/0073599 A1 | 3/2012 | Miya | |
| 2012/0094493 A1 | 4/2012 | Hizawa et al. | |
| 2012/0304483 A1* | 12/2012 | Sirard | H01L 21/67109 34/92 |
| 2014/0014142 A1 | 1/2014 | Hizawa et al. | |

FOREIGN PATENT DOCUMENTS

| | | | | |
|---|---|---|---|---|
| JP | H7-20637 A | | 1/1995 | |
| JP | 2008-60368 A | | 3/2008 | |
| JP | 2011-124313 A | | 6/2011 | |
| JP | 2011124313 | * | 6/2011 | ........... H01L 21/027 |
| JP | 2012-84789 A | | 4/2012 | |

* cited by examiner

SUBSTRATE PROCESSING METHOD AND SUBSTRATE PROCESSING APPARATUS

CROSS-REFERENCE TO RELATED APPLICATIONS

This application is a continuation of U.S. patent application Ser. No. 16/357,151, filed on Mar. 18, 2019, which is a division of U.S. application Ser. No. 14/940,186, filed on Nov. 13, 2015 (now abandoned), which is a division of U.S. application Ser. No. 13/541,167, filed on Jul. 3, 2012 (now U.S. Pat. No. 9,213,242), which claims the benefit of priority from the prior Japanese Patent Application No. 2011-149367, filed on Jul. 5, 2011, the entire contents of which are incorporated herein by reference.

FIELD

Embodiments described herein relate generally to a substrate processing method and a substrate processing apparatus.

BACKGROUND

In the process of manufacturing semiconductor devices, Micro Electro Mechanical Systems (MEMS), recording media such as a hard disk, photo-masks, and display devices using thin film transistors such as a liquid crystal display and an EL display or the like, substrates (objects to be processed) are treated with liquid. For example, patterning is carried out on substrates, stacked films, resist films, and so on by liquid treatment and the like to form minute structural bodies on the substrates. Further, impurities or residues remaining on substrates are removed by cleaning using liquid. In addition, these processes are carried out in combination.

When removing the liquid after liquid treatment, sometimes the minute structural bodies formed on the substrates collapse due to the surface tension of the liquid. In particular, as patterns are down-sized and the aspect ratios of structural bodies become higher, pattern collapse when removing the liquid can easily occur.

DETAILED DESCRIPTION

Figure 1:
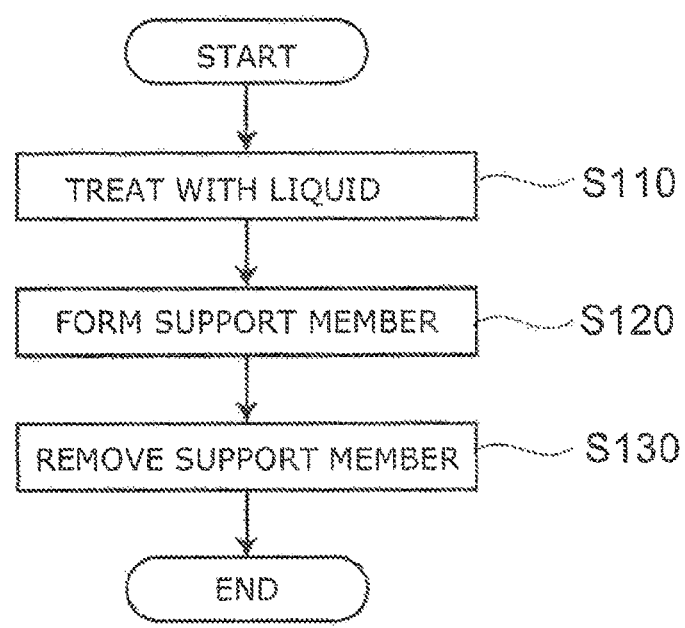
FIG. 1 is a flowchart illustrating a substrate processing method according to a first embodiment.

According to one embodiment, a substrate processing method is disclosed. The method can include treating a substrate with a first liquid. The substrate has a structural body formed on at least a major surface of the substrate. The method can include forming a support member supporting the structural body by bringing a second liquid into contact with the substrate wetted by the first liquid, and changing at least a portion of the second liquid into a solid by carrying out at least one of causing the second liquid to react, reducing a quantity of a solvent included in the second liquid, and causing at least a portion of a substance dissolved in the second liquid to be separated. The method can include removing the support member by changing at least a part of the support member from a solid phase to a gaseous phase, without passing through a liquid phase.

According to another embodiment, a substrate processing apparatus includes a holding unit, a supplying unit, a processing unit, and a control unit. The holding unit is configured to hold a substrate. The supplying unit is configured to supply a liquid substance onto the substrate. The processing unit is configured to carry out at least one of processes of heating, cooling, light irradiation, electron beam irradiation, pressure application, pressure reduction, and gas supply, with respect to the substrate. The control unit is configured to cause the holding unit, the supplying unit and the processing unit to carry out a series of operations of treating the substrate with a first liquid, forming a support member on the substrate by bringing a second liquid into contact with the substrate that is wetted by the first liquid, and changing at least a portion of the second liquid into a solid by carrying out at least one of causing the second liquid to react, reducing a quantity of a solvent included in the second liquid, and causing at least a portion of a substance dissolved in the second liquid to be separated, and removing the support member by changing the support member from a solid phase to a gaseous phase, without passing through a liquid phase.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to constituents that have already appeared in the drawings and been described, and repetitious detailed descriptions of such constituents are omitted.

First Embodiment

FIG. 1 is a flowchart illustrating a substrate processing method according to a first embodiment.

FIG. 2A to FIG. 2E are schematic cross-sectional views illustrating the substrate processing method according to the first embodiment.

As shown in FIG. 1, the substrate processing method according to the first embodiment includes treating a substrate with a liquid (Step S110).

Figure 2A:
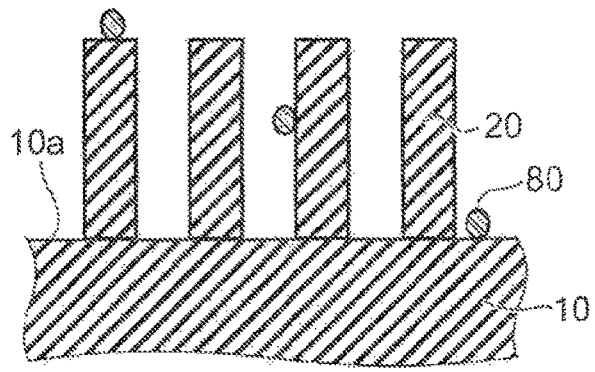
FIG. 2A to FIG. 2E are schematic cross-sectional views illustrating the substrate processing method according to the first embodiment.

For example, as shown in FIG. 2A, a substrate 10 has a structural body 20 formed on a major surface 10a of the substrate 10. In this example, a plurality of structural bodies 20 are provided.

Any substrates such as various types of semiconductor substrates such as silicon or the like, a substrate that includes a semiconductor layer formed on an insulating layer provided on a base body, conductive substrates, insulating substrates, and so on, can be used as the substrate 10. The substrate 10 can include a base body and a layer having various structural bodies formed on the base body.

The structural body 20 can be, for example, a portion of the major surface 10a of the substrate 10 that is processed into a concave and convex shape. The structural body 20 can be, for example, a concave and convex portion that is formed by processing a film to be processed. The structural body 20 can be a structural body formed on the substrate 10 from a different material from the substrate 10. The structural body 20 can be, for example, a patterned resist. In other words, the structural body 20 is made from a material that includes organic resin. The structural body 20 can be, for example, a hard mask formed with a pattern on a film that is to be processed. For example, the structural body 20 is made from an inorganic material.

Thus, the structural body 20 may be made from an organic material or from an inorganic material, or may be a mixture of these, or may be a stacked body with an organic layer and an inorganic layer. The structural body 20 may be made from electrically conducting material or from electrically insulating material, or may be a stacked body with a conductive layer and an insulating layer. The structural body 20 can include a semiconductor layer. The structural body 20 can include a stacked film with a semiconductor layer and another layer.

The structural body 20 can have, for example, a line and space pattern (for example grooves). The structural body 20 can have a pattern of holes or pillars, and so on.

Thus, a structural body having concave and convex made from an arbitrary material and having an arbitrary shape can be used as the structural body 20.

In the following, the substrate processing method according to the embodiment is described as an example in which the structural body 20 provided on the major surface 10a of the substrate 10 is cleaned with a liquid.

That is, as shown in FIG. 2A, particle 80 such as impurities, residues, particles, and so on are attached to the structural body 20, Cleaning using a liquid is carried out to remove this particle 80.

Figure 2B:
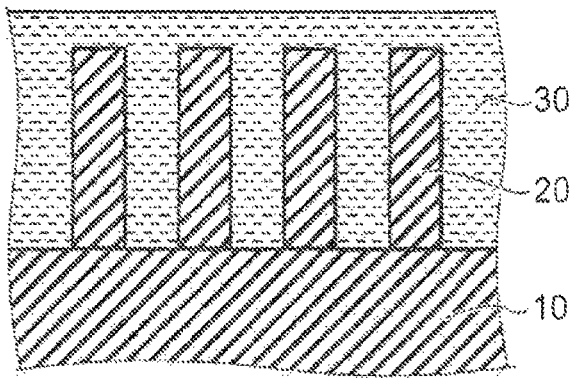

As shown in FIG. 2B, the substrate 10 is treated with a liquid 30. For example, the liquid 30 is applied to the major surface 10a of the substrate 10 using a spinner. The substrate 10 is soaked in the liquid 30. The method of treating the substrate 10 with the liquid 30 is arbitrary. By treating the substrate 10 with the liquid 30, the particle 80 is removed, for example.

The liquid 30 can be an arbitrary liquid substance, for example, water, an aqueous solution, a water soluble solvent, a non-aqueous solvent, or a mixture of these. Examples of the liquid 30 are given later.

As shown in FIG. 1, after treating with the liquid 30 (in this example, the cleaning process), a support member 45 is formed. In other words, the substrate processing method further includes a process of forming the support member 45 to support the structural body 20 (Step S120).

Figure 2C:
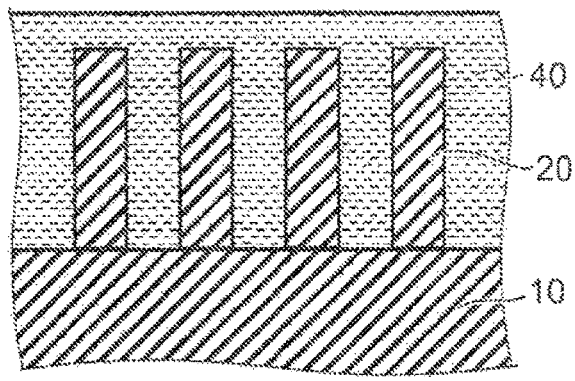

As shown in FIG. 2C, in this process, the structural body 20 wetted by the liquid 30 which is a first liquid is brought into contact with a solution 40 as a second liquid.

The solution 40 includes, for example, a solvent and a solid dissolved in the solvent. The solution 40 includes, for example, a plurality of materials that react with each other. The solution 40 includes, for example, a material that reacts with the surface of the substrate 10 or the surface of the structural body 20 on the substrate 10.

Figure 2D:
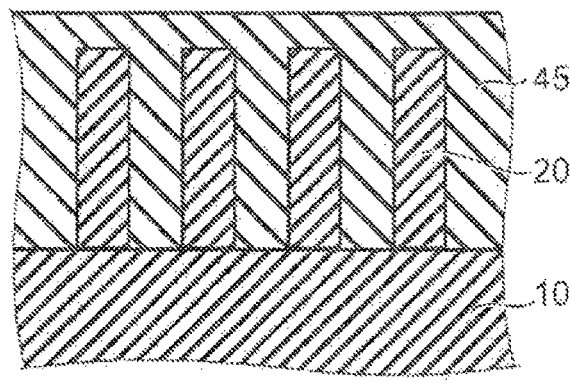

As shown in FIG. 2D, at least a portion of the solution 40 is changed into a solid to form the support member 45 that supports the structural body 20. When changing the solution 40 into a solid, methods such as, for example, causing the solution 40 to react, reducing a quantity of a solvent included in the solution 40 (vaporizing the solvent, for example), and causing at least a portion of a substance dissolved in the solution 40 to be separated (by a plating method, for example), and so on can be used. Thus, at least a portion of the solution 40 is changed into a solid, and the support member 45 is formed from the solid.

Figure 2E:
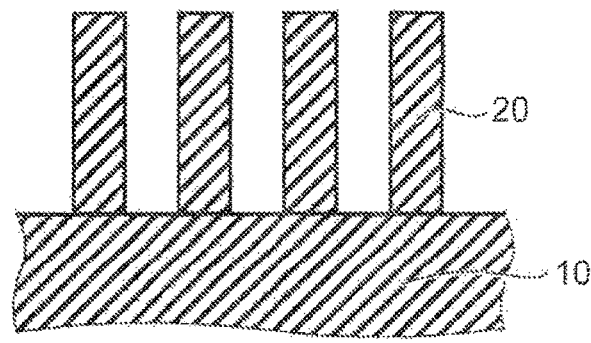

As shown in FIG. 1 and FIG. 2E, the support member 45 is removed (Step S130). Thereby, at least a part of substance included in the support member 45 is changed from a solid phase to a gaseous phase, without passing through a liquid phase. In other words, at least a part of the substance included in the support member 45 that supports the structural body 20 is changed directly from the solid phase to the gaseous phase. Thereby, it is possible to suppress collapse of the structural body 20 by not applying surface tension of the liquid to the structural body 20.

Thus, according to the embodiment, it is possible to suppress pattern collapse when drying after the liquid treatment.

FIG. 3A to FIG. 3H are schematic views showing an example of the substrate processing method according to the first embodiment.

In these drawings, the structural body 20 provided on the substrate 10 is omitted, for simplicity.

Figure 3A:
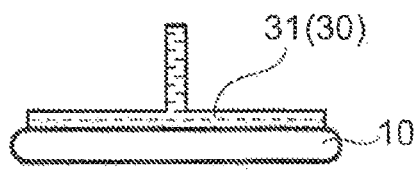
FIG. 3A to FIG. 3H are schematic views showing an example of the substrate processing method according to the first embodiment.
Figure 3B:
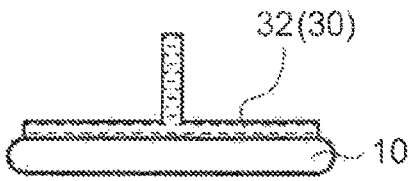
Figure 3C:
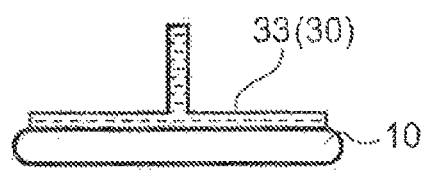
Figure 3D:
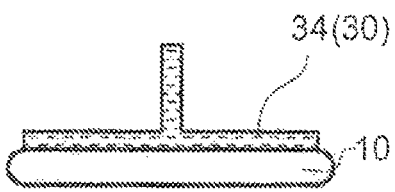

As shown in FIG. 3A, treating is carried out with a liquid chemical 31. The liquid chemical 31 is, for example, a cleaning liquid, a developing liquid, an etching liquid, or the like. Then, as shown in FIG. 3B, rinsing is carried out using, for example, de-ionized water 32. As shown in FIG. 3C, treating is carried out using a water soluble solvent 33. Isopropyl alcohol (IPA), for example can be used as the water soluble solvent 33. As shown in FIG. 3D, treating is carried out using a non-aqueous solvent 34. The solvent included in the solution 40, which is used later, can be used as the non-aqueous solvent 34, for example. A solvent that has high affinity for the solvent included in the solution 40 can be used as the non-aqueous solvent 34. The processes described in connection with FIG. 3A to FIG. 3D are included in treating the substrate 10 with the liquid 30 (Step S110).

Figure 3E:
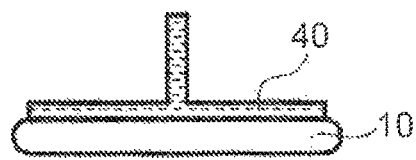

As shown in FIG. 3E, the solution 40 that will form the support member 45 is brought into contact with the substrate 10 (structural body 20). In addition, the solution 40 is cured by vaporizing the solvent included in the solution 40, or causing a reaction in the solution 40. At least a portion of the substance dissolved in the solution 40 is separated.

Figure 3F:
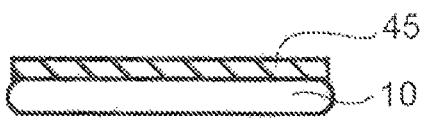

Thus, as shown in FIG. 3F, the support member 45 is formed. This process is included in the process of forming the support member 45 (Step S120).

Figure 3G:
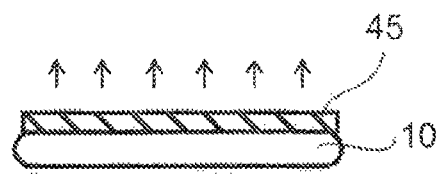
Figure 3H:
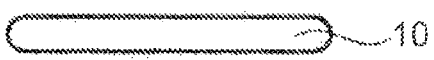

Then, as shown in FIG. 3G, the support member 45 is brought into contact with, for example, high temperature nitrogen, and the support member 45 is changed directly from the solid phase to the gaseous phase. Thereby, the support member 45 is removed, as illustrated in FIG. 3H. In other words, Step S130 is performed.

For example, alcohols, polyvalent alcohols, pyrolidone type solvents, lactones or the like can be used as the water soluble solvent 33 as described above. Specifically, a solvent that includes at least one solvent selected from the group that includes, for example, methanol, ethanol, IPA, butanol, ethylene glycol, propylene glycol, NMP (N-methyl-2-pyrolidone), DMF (N,N-dimethyl formaldehyde), DMA (N,N-dimethyl acetamide), DMSO (dimethyl sulfoxide), and gamma-butyrolactone (GBL), fluorine alcohol (alcohol including carbon fluoride) or the like can be used as the water soluble solvent 33.

The non-aqueous solvent 34 is an organic liquid substance that includes substantially no water. Solvents that include alcohols, polyvalent alcohols, pyrolidone type solvents, or the like that include substantially no water can be used as the non-aqueous solvent 34, Specifically, a solvent that includes at least one solvent selected from the group that includes, for example, methanol, ethanol, IPA, butanol, ethylene glycol, propylene glycol, NMP, DMF, DMA, DMSO, GBL and fluorine alcohol that include substantially no water can be used as the non-aqueous solvent 34. For example, a solvent that includes the solvent included in the solution 40 that will form the support member 45 can be used as the non-aqueous solvent 34. For example, a solvent that includes an aliphatic hydrocarbon, an aromatic hydrocarbon, an ester, an alcohol, an ether, or a mixture of these can be used. Specifically, a solvent that includes methanol, ethanol, IPA, butanol, ethylene glycol, propylene glycol, NMP, DMF, DMA, DMSO, hexane, toluene, propylene glycol monomethyl ether acetate (PGMEA), propylene glycol monomethyl ether (PGME), propylene glycol monopropyl ether (PGPE), propylene glycol monoethyl ether (PGEE), gamma butyrolactone (GBL), acetylacetone, 3-pentanone, 2-heptanone, ethyl lactate, cyclohexanone, dibutyl ether, hydrofluoroether (HFE) (ethyl nonafluoroisobutyl ether, ethyl nonafluorobutyl ether, or the like), m-xylene hexafluoride, or mixtures thereof can be used. In some cases, water may be included.

When the water soluble solvent 33 is the same as the non-aqueous solvent 34, one of the treatments may be omitted. Both treatment with the water soluble solvent and treatment with the non-aqueous solvent may be omitted.

The support member 45 can be made of any material despite of organic or inorganic and can include at least any of, for example, a methacrylic resin material, a styrene resin material, and a fluorocarbon material (for example, a material that includes a perfluoro group), and so on. A resist material can be used for the support member 45. In this case, the resist material may or may not be photosensitive.

The support member 45 may include a sublimation material. The support member 45 may include at least one of the polymer material and the sublimation material or the like, or a material having two or more of these mixed. The sublimation material can include, for example, iodine, naphthalene and benzotriazole (BTA) or the like.

For example, it is favorable that dissolved material (for example, solute) contained in the solution 40 has, for example, a melting point higher than a room temperature (for example, 20° C. or more) and includes a material sublimating at an atmospheric pressure (1 atmosphere) or lower. This makes the process easy. The dissolved material (solute) contained in the solution 40 includes, for example, 1,2,3-benzotriazole.

At this time, IPA can be used, for example, for solvent contained in the solution 40. For example, IPA of 20 milliliters (mL) with dissolved 1,2,3-benzotriazole of 1 gram (g) can be used. A ratio of the solute to the solution 40 is, for example, 5% or lower in ratio by weight.

Changing of the solution 40 into a solid (forming of the support member 45) can include, for example, reducing the quantity of the solvent included in the solution 40 (by vaporization, for example). Changing of the solution 40 into a solid can include causing a plurality of materials included in the solution 40 to react to cure the solution 40. It can include causing at least a portion of the material included in the solution 40 to be separated. In this case, oxidation-reduction reactions or the like may be used, and reaction with the surface of the substrate 10 or the structural body 20 can be used.

For example, changing of the solution 40 into a solid can include carrying out at least one of a heating process, a cooling process, a pressure application process, a pressure reduction process, a spin drying process, a gas supply drying process and a natural drying process. Thus, the support member 45 can be easily formed from the solution 40 by causing at least any one of reduction of the quantity of the solvent, and curing by reacting.

For example, changing of the solution 40 into a solid can include a heating process and/or a light irradiation process, and so on. Thereby, the reaction and curing of the solution 40 is promoted.

To remove the support member 45, a heating process (for example, processing at high temperature using an inert gas (including nitrogen) or heating using a hot plate and a heater or the like), an ultra violet light irradiation process, an electron beam irradiation process, a pressure reduction process, a process using a reactive gas, an ashing process using plasma or radicals, or a dry etching process, and so on can be used. In this way, changing of the support member 45 from a solid phase to a gaseous phase can include at least any of a heating process, a light irradiation process, an electron beam irradiation process, a pressure reduction process, and a process using a gas that reacts with the support member 45.

When heating in a reduced pressure atmosphere, for example, heating is performed at a temperature of melting point of the solute or lower. 1,2,3-tribenzotriazole (melting point of 95° C.) is used as the solute, and when heating, for example, heating is performed at a temperature of 95° C. or lower.

At this time, the support member 45 becomes a gaseous phase by sublimation, decomposition, or by reaction. In other words, changing of the support member 45 from a solid phase to a gaseous phase includes carrying out at least any of sublimation, decomposition, and reaction of the support member 45. Thus, the support member 45 is changed directly from the solid phase to the gaseous phase, without passing through the liquid phase. When the support member 45 includes two or more materials such as the polymer material and the sublimation material or the like, at least a material removed at the last of the removing process of the support member 45 of the two or more materials is made to change from the solid phase to the gaseous phase without passing through the liquid phase. In other words, in the intermediate of the process, a part of the materials may change to the gaseous phase with passing through the liquid phase. The removing method of the support member 45 is not limited to the sublimation, the decomposition or the reaction. Changing to the gaseous phase without passing through the liquid phase in the last of the process is performed.

On the other hand, after the substrate 10 is treated with the liquid 30 (for example, water, IPA, or the like), if the liquid 30 is dried by spin drying, vapor drying or the like, surface tension of the liquid 30 will act on the structural body 20, and cause pattern collapse.

In contrast, in the embodiment, after a treatment with the liquid 30, the liquid 30 is replaced with the solution 40, and then the support member 45 is formed from the solution 40. Then, the support member 45 is changed directly from the solid phase to the gaseous phase, without passing through the liquid phase. Thereby, as shown in FIG. 2E, it is possible to suppress pattern collapse when drying after a liquid treatment.

In this example, a plurality of structural bodies 20 are disposed on the major surface 10a of the substrate 10. At this time, the support member 45 suppresses tilting of the structural bodies 20 with respect to the major surface 10a. For example, the support member 45 suppresses changes in the distance (the distance along axes parallel to the major surface 10a) between the plurality of structural bodies 20.

As a reference example, a method in which the substrate is treated with a rinsing liquid or the like, the rinsing liquid is frozen, and then dried by sublimation (vaporization) can be conceivable. However, in this case, the temperature of the rinsing liquid is extremely lowered to freeze it, so the equipment is very expensive, and the time required for processing is long. Therefore this method has low productivity, and it is difficult to adopt in practice. Further, there is a problem of damage to the structural members 20 due to volume changes during freezing.

In the method of vaporization after the liquid is frozen, a portion becomes a liquid phase in the process of vaporization, so the controllability of the process is poor, and depending on the circumstances it is difficult to sufficiently suppress collapses. In particular, if any troubles occur after freezing, the frozen rinsing liquid will be returned to the liquid phase, so there is problem in which the collapses cannot be suppressed.

In contrast, in the embodiment, when changing the solution 40 into a solid, the solution 40 is reacted, for example. The quantity of the solvent included in the solution 40 is reduced (for example, by vaporizing the solution). Therefore, it is not necessary to lower the temperature, processing is simple, and the configuration of the processing equipment is simple. The support member 45 formed in this way is desirably a solid phase under room temperature and atmospheric pressure. In this case, even if some troubles occur after forming the support member 45, it is possible to prevent collapses without returning to the liquid phase. Thereafter, the support member 45 is processed by a heating process, a light irradiation process, an electron beam irradiation process, a pressure reduction process, a process using a reactive gas, or the like. In this process, when changing the support member 45 from the solid phase to the gaseous phase, the support member 45 does not pass through the liquid phase. Therefore, the controllability of the process is good, and it is possible to complete the process using simple equipment without carrying out a liquid drying process.

In the embodiment, when changing the solution 40 into a solid, it is possible to shorten the processing time by using high temperatures (for example, 50° C. to 200° C.).

In the embodiment, at least one of a methacrylic resin material, a styrene resin material, and a fluorocarbon resin material (for example a material that includes a perfluoro group) is favorably used in the support member 45. It has been confirmed that these materials reduce mass by a heat process (for example, a process at 200° C. or higher), and they easily change from a solid phase to a gaseous phase by a heating process. Since, it is comparatively easy to carry out a heating process, the configuration of the equipment becomes simple.

In other words, the solution 40 for forming the support member 45 favorably includes a solvent and at least any of a methacrylic resin material, a styrene resin material, and a fluorocarbon resin material (for example, a material that includes a perfluoro group). This solvent favorably includes at least one of an aliphatic hydrocarbon, an aromatic hydrocarbon, an ester, an alcohol, an ether, and a fluorine solvent, or a mixture of these.

When the support member 45 includes two or more materials such as the polymer material and the sublimation material or the like, the solution 40 favorably includes these materials and the above solvent. When the support member 45 includes the sublimation materials such as iodine, naphthalene, BTA, the solution 40 favorably includes the sublimation material and the solvent.

The solution 40 can include a compound that can react, and a reaction initiating agent that induces the reaction. In this case, the solution 40 may not include a solvent. The reaction of the compound is initiated or promoted by the reaction initiating agent, using a stimulus such as heat or light. For example, a thermosetting or a photo-curing resin compound can be used as the compound that can react.

A material with different properties from the structural body 20 is favorably used in the support member 45, so that when removing the support member 45, it is easy to keep the pattern of the structural body 20. For example, if the structural body 20 is an inorganic material, an organic material can be used as the support member 45. If the structural body 20 is an organic material, an inorganic material can be used as the support member 45. Provided the properties of the structural body 20 and the properties of the support member 45 are different, the support member 45 and the structural body 20 may be both inorganic materials, or both organic materials, or a mixture of both organic and inorganic materials. The thermal resistance (for example, the change rate in mass at high temperature, or the like) of the support member 45 is preferably lower than the thermal resistance of the structural body 20. When an etchant (an arbitrary reactive gas in vapor or gaseous form) is used for removal of the support member 45, the etching rate of the support member 45 with respect to the etchant is higher than the etching rate of the structural body 20.

In the embodiment, treating the substrate 10 with the liquid 30 desirably includes treating the substrate 10 with a liquid that includes alcohol (including IPA). By treating with alcohol after treating the substrate 10 with water, the water is replaced with the alcohol, and the subsequent treating with the solution 40 is carried out uniformly.

Specifically, as described in connection with FIG. 3A to FIG. 3H, treating the substrate 10 with the liquid 30 desirably includes treating the substrate 10 with a water soluble solvent 33 (for example alcohol or the like) (the process illustrated in FIG. 3C), and treating the substrate 10 that has been treated with the water soluble solvent 33 using a non-aqueous solvent 34 (a solvent that includes substantially no water) (the process illustrated in FIG. 3D). Frequently an organic solvent that does not include water is used in the solution 40 that will become the support member 45. By treating with the non-aqueous solvent 34 after treating with the water soluble solvent 33 that can easily replace the water, replacement of the water soluble solvent 33 with the solution 40 is smoothly carried out. Thereby, the surface of the substrate 10 is uniformly covered with the solution 40. Then, uniform processing can be carried out. When the solution 40 includes water, treating with the liquid 30 does not have to include treating with the water soluble solvent 33 and/or the non-aqueous solvent 34.

FIG. 4A to FIG. 4D are schematic cross-sectional views illustrating a specific example of the substrate processing method according to the first embodiment.

Figure 4A:
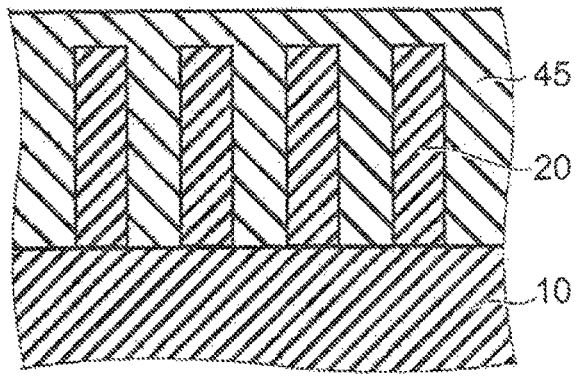
FIG. 4A to FIG. 4D are schematic cross-sectional views illustrating a specific example of the substrate processing method according to the first embodiment.

As shown in FIG. 4A, the structural body 20 is substantially completely embedded in the support member 45. In other words, the thickness (height) of the support member 45 is thicker than the height of the structural body 20, and the top surface of the support member 45 is substantially flat. In this way, the structural body 20 can be embedded in the support member 45. Thereby, the structural body 20 is strongly supported by the support member 45, and pattern collapse is reliably suppressed.

Figure 4B:
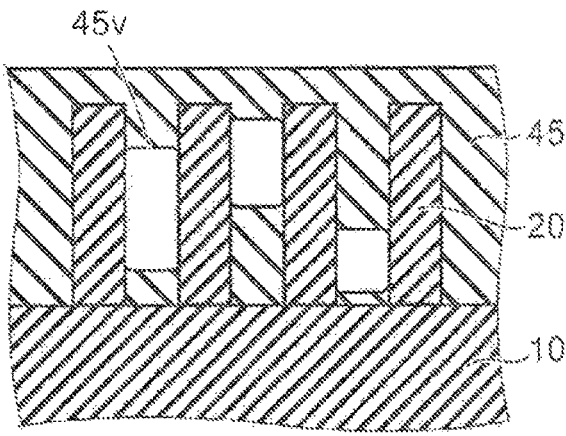

As shown in FIG. 4B, spaces 45v are formed in a portion of the support member 45 between the plurality of structural bodies 20. Thereby, in the process of forming the support member 45, the support member 45 can be formed leaving the spaces 45v in intervals between the plurality of structural bodies 20. Particularly, the support member 45 may be formed only on an upper portion of the plurality of structural bodies.

Figure 4C:
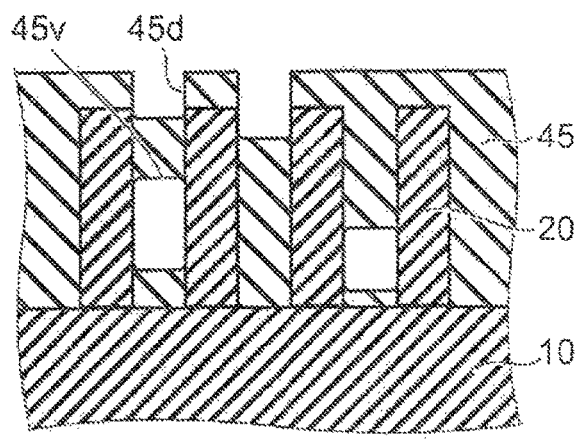

As shown in FIG. 4C, recesses 45d are formed in a portion of or all the top surface of the support member 45.

Thus, by forming the support member 45 so that the spaces 45v and the recesses 45d are formed, the support member 45 becomes easier to be removed, so the productivity is improved.

Figure 4D:
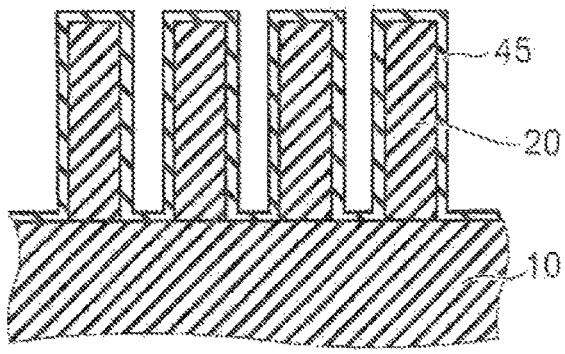

As shown in FIG. 4D, the support member 45 is formed in a thin film along the side surfaces and top surfaces of the plurality of structural bodies 20. In addition, the support member 45 is also formed on the surface of the substrate 10 between the pluralities of structural bodies 20. In this case, since the thickness of the support member 45 is thin, the support member 45 is easily removed, which increases the productivity. In this example, the support member 45 completely covers the side surfaces and the top surfaces of the structural bodies 20, but the embodiment is not limited to this. For example, the support member 45 may be provided on a portion of the side surfaces of the structural bodies 20 and thereby, the support member 45 makes possible to suppress the collapse of the structural body 20.

As shown in FIG. 4A to FIG. 4D, the support member 45 covers at least a portion of the structural bodies 20. Thereby, the strength of the structural bodies 20 is increased, and it is possible to suppress the pattern collapse.

As shown in FIG. 4B, it is possible to suppress pattern collapse even when the spaces 45v are formed in entirety or in parts. As shown in FIG. 4C, it is possible to suppress pattern collapse even when the recesses 45d are formed in the top surface of the support member 45. As shown in FIG. 4D, even when the support member 45 is formed on the side surfaces of the structural body 20, without the structural body 20 being embedded in the support member 45, it is possible to strengthen the structural body 20. Thus, the pattern collapse can be suppressed.

When the support member 45 is formed on the side surfaces of the structural body 20, as shown in FIG. 4D, a material with low wettability with respect to a desired liquid is favorably used as the support member 45. For example, the contact angle of the material with the low wettability with respect to the liquid is larger than the contact angle of the structural body 20 with respect to the liquid. At this time, prior to vaporization and removal of the support member 45, treating the substrate 10 on which the support member 45 has been formed on the side surfaces of the structural body 20, with a desired liquid may be added. Thereby, it is possible to more effectively suppress the pattern collapse when drying the liquid. The desired liquid is, for example, liquid having a lower surface tension than water. That is, the desired liquid is, for example, a third liquid such as alcohol or other water-soluble solvent.

For example, by using the support member 45 that has a high contact angle with respect to the preferred solvent (liquid) (for example, higher than that of the structural body 20), it is possible to suppress the pattern collapse when drying the solvent (liquid) on the substrate 10. When the support member 45 includes a polar material, the desired liquid is favorably nonpolar. On the other hand, when the support member 45 includes a nonpolar material, the desired liquid is favorably polar. By forming the support member 45, the contact angle with respect to the liquid which has a lower surface tension than water is increased.

Specifically if a material with a high contact angle with respect to water and alcohols, such as methanol, ethanol, IPA, and the like is used as the support member 45, it is possible to suppress the pattern collapse when drying the alcohol or water from the substrate 10.

By treating with an alcohol-repellent treatment liquid, the contact angle with respect to alcohol on the surface of the substrate 10 will be increased, so alcohol will be repelled from the surface. For example, a fluorocarbon resin material (for example, a material having a perfluoro group) or the like can be used as an alcohol-repellent treatment liquid.

Here, when forming the support member 45, the solution 40 for forming the support member 45 is desirably not completely dried. For example, by cooling the solution 40 on the substrate, it is possible to cause separation of the dissolved support member 45 in the solution. For example, by vaporizing a portion of the solvent in the solution 40 on the substrate (for example, by heating the substrate or the like), it is possible to cause separation by increasing the concentration of the dissolved support member 45. For example, it is possible to form the support member 45 by following process. An organic functional group is formed on the surface of at least a part of the substrate 10 and/or the structural body 20 by chemical bonding (for example, by a silane coupling reaction, or the like), or by physical adsorption (for example, by adsorption of a surfactant or the like). Further, the formed organic functional group is replaced with a functional group having a fluorocarbon, or the formed organic functional group is added with a functional group having a fluorocarbon. The formed organic functional group itself may be a functional group having a fluorocarbon (for example, a perfluoro group or the like).

Then, the substrate 10 is treated with alcohol (for example, IPA) or the like, and the alcohol is removed by, for example, the spin dry method, and the substrate 10 is dried. Thereby, it is possible to suppress the occurrence of marks of uneven drying (for example, water marks and so on) when drying from the alcohol, while suppressing the pattern collapse when drying after liquid treatment.

Thus, in this method, the substrate 10 having the structural bodies 20 formed on the major surface 10a is treated with a liquid that includes water (first process). A process is carried out on the substrate 10 on which the first process has been carried out, to form a surface modified layer using a treatment liquid, so that liquid with lower surface tension than that of water (for example, alcohol) is repelled (second process). In addition, after the second process, the substrate 10 is treated with a liquid with lower surface tension than that of water (for example, alcohol) (third process). Thereafter, drying is carried out.

In this method, the liquid with lower surface tension lower than that of water referred to above is desirably a water soluble solvent (for example alcohol). Thereby, after the first process using a liquid that includes water, it becomes easy to replace the water with the liquid having lower surface tension than that of water, so it is possible to further suppress the occurrence of unevenness.

Specifically, at least any of an alcohol, a polyvalent alcohol, lactones, and a pyrolidone type solvent is favorably used as the liquid having a surface tension lower than that of water referred to above. Thus, the process affinity is increased in the various processes, so it is possible to carry out stable uniform processing with good productivity.

Here, a fourth process using a liquid including water may be performed between the second process and the third process. In this case, in the third process after the fourth process, the liquid including water on the substrate 10 is replaced with a liquid having lower surface tension than that of water.

In this method, the atmosphere can be controlled when the liquid with lower surface tension than that of water is dried. For example, at least one of nitrogen, dried air, water vapor, and vapor of a liquid having lower surface tension than that of water can be used.

The layer in which the surface was modified using the alcohol-repellent treatment liquid can be removed in the gaseous state. For example, a heating process, a plasma process, an ashing process, an ultra violet light irradiation process, an electron beam irradiation process, and so on can be used for this removal. During the next process that is implemented after drying the substrate 10, the surface modified layer may be automatically removed by the alcohol-repellent treatment liquid.

If the surface modified layer is formed using an alcohol-repellent treatment liquid, treating may be carried out using a liquid such as alcohol or the like and then drying the liquid, without changing the treatment liquid into a solid by vaporization of the solvent or reaction to cure the solvent. In other words, even if the alcohol-repellent treatment liquid is directly replaced with a desired liquid such as alcohol or the like on the substrate 10, a surface modified layer that repels alcohol or the like is formed on the side surfaces of the structural body 20. Therefore, it is possible to dry the liquid such as alcohol or the like while suppressing pattern collapse.

Figure 5A:
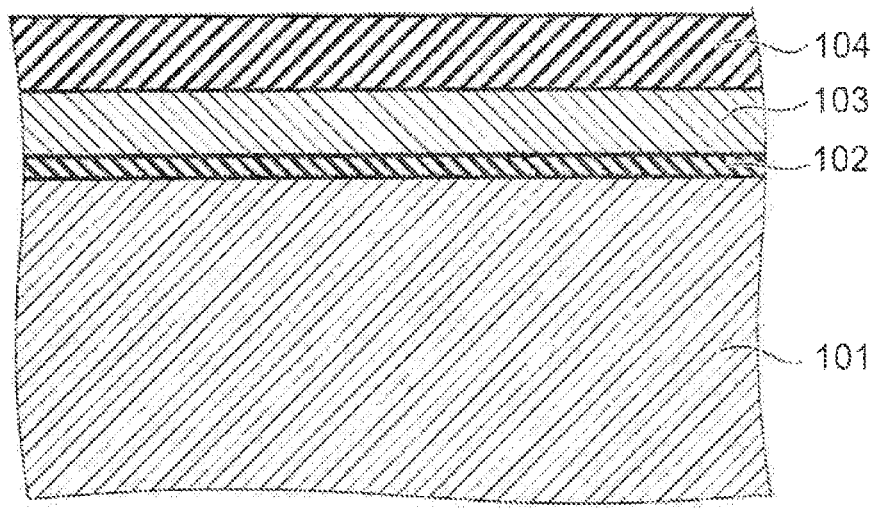
FIG. 5A and FIG. 5B are schematic cross-sectional views illustrating a process that applies the substrate processing method according to the first embodiment.
Figure 5B:
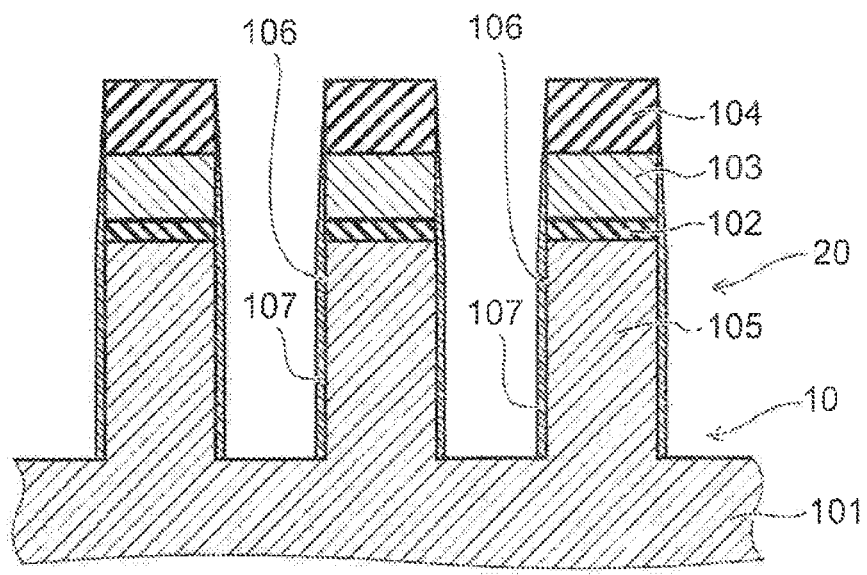

FIG. 5A and FIG. 5B are schematic cross-sectional views illustrating a process that applies the substrate processing method according to the first embodiment.

These drawings illustrate examples of the structural body 20 provided on the substrate 10. FIG. 5A shows the state prior to the processing for forming the structural body 20, and FIG. 5B shows the state after the processing. These drawings illustrate the processing of device separation structure formed in a memory cell region of a NAND type flash memory device.

As shown in FIG. 5A, a gate insulating film 102 made of a silicon oxide film is provided on a silicon substrate 101 (semiconductor substrate). A polycrystalline silicon film 103 that forms a floating gate electrode is provided on the gate insulating film 102. In addition, a silicon nitride film 104 is provided on the polycrystalline silicon film 103.

For example, a resist mask (not illustrated on the drawings) having a predetermined shape is formed on the stacked body recited above. The resist mask has, for example, a line and space band-type shape. Using the resist mask as a mask, the silicon nitride film 104 is patterned using, for example, Reactive Ion Etching (RIE). Using the patterned silicon nitride film 104 as a mask, the polycrystalline silicon film 103, the gate insulating film 102, and a portion of the silicon substrate 101 are patterned.

In this way, trenches 106 are formed in the stacked body, as shown in FIG. 5B. In this way, the surface layer portion of the silicon substrate 101 is separated, forming portions 105 that will become active regions. Thereby, the structural bodies 20 in a band form separated by the trenches 106 are formed. The silicon substrate 101 corresponds to the substrate 10.

The width of the structural bodies 20 is for example larger than 10 nm (nanometers) and less than 50 nm. Specifically, the width is, for example, about 30 nm. The aspect ratio of the structural bodies 20 is, for example, larger than 5 and less than 30. Specifically, the aspect ratio is about 8. When the width of the structural bodies 20 is 30 nm and the aspect ratio is 8, the height of the structural bodies 20 is 240 nm.

In this example, residue 107 exists on the sidewalls of the trenches 106.

The substrate processing method according to the embodiment can be applied to, for example, treating with a liquid for developing when processing the above resist mask. It can be applied to treating with a liquid to remove the residue 107.

Figure 6A:
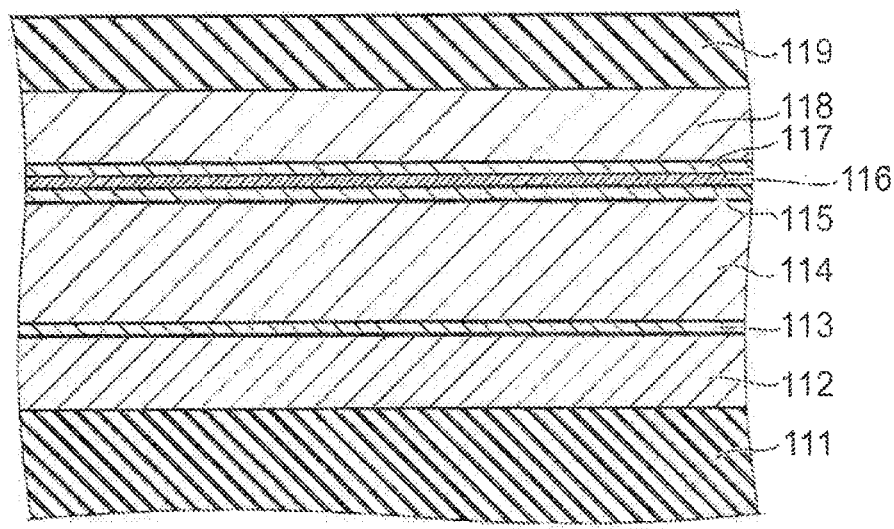
FIG. 6A and FIG. 6B are schematic cross-sectional views illustrating another process that applies the substrate processing method according to the first embodiment.
Figure 6B:
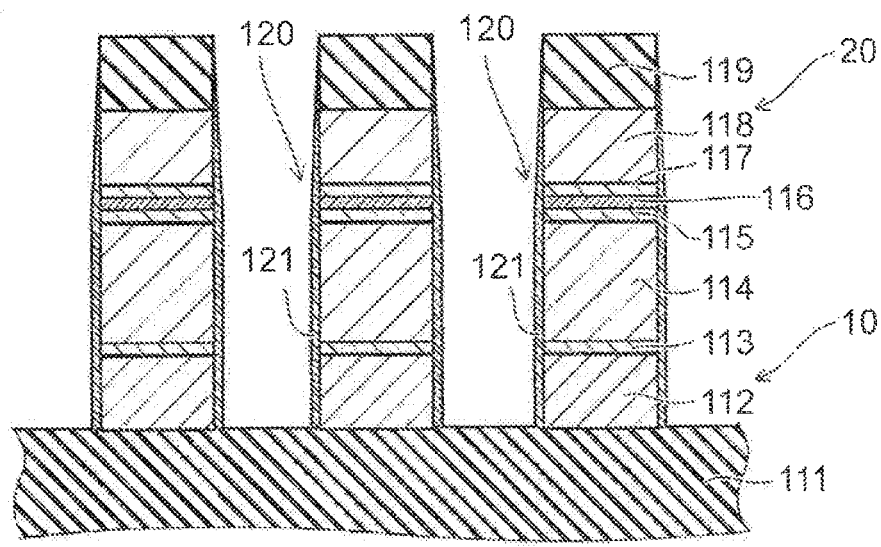

FIG. 6A and FIG. 6B are schematic cross-sectional views illustrating another process that applies the substrate processing method according to the first embodiment.

These drawings illustrate structural bodies 20 provided on the substrate 10. FIG. 6A shows the state prior to the processing for forming the structural bodies 20, and FIG. 6B shows the state after the processing. These drawings illustrate processing of memory devices and rectifying devices (for example diodes) formed in the memory cell region of a variable resistance type of memory device. The rectifying devices are for selecting the memory devices. In this example, the memory device portion and the rectifying device portion are processed together. A variable resistance type of memory device is one type of a three-dimensional memory device.

As shown in FIG. 6A, an insulating film 111 is provided. The insulating film 111 is provided on a semiconductor substrate, for example. A tungsten film 112 that forms a word line, a titanium nitride film 113, and a polycrystalline silicon layer 114 are stacked in that order on the insulating film 111. The polycrystalline silicon layer 114 has a diode structure. A lower electrode film 115 that forms a memory device, a variable resistance film 116, and an upper electrode film 117 are stacked in that order on the polycrystalline silicon layer 114. In addition, a tungsten film 118 that forms a CMP stopper is provided on the upper electrode film 117, and a hard mask film 119 for processing is provided on the tungsten film 118.

A resist mask (not illustrated on the drawings) having a predetermined shape is formed on this stacked body, and using the resist mask as a mask, the hard mask film 119 is processed into a predetermined shape. Then, using the hard mask 119 as a mask, the tungsten film 118, the upper electrode film 117, the variable resistance film 116, the lower electrode film 115, the polycrystalline silicon layer 114, the titanium nitride film 113, and the tungsten film 112 are patterned by etching at the same time by, for example, RIE. Thereby, a plurality of memory devices 120 is formed.

In this example, etching residue 121 adheres to the side surfaces of the plurality of memory devices 120.

The substrate processing method according to the embodiment can be applied to, for example, treating with a liquid for developing when processing the above resist mask. It may be applied to treating with a liquid for removing the above residue 121.

These methods can also be used to suppress pattern collapse when forming DRAM capacitors (in particular cylinders) and so on.

FIG. 7A to FIG. 7E are schematic cross-sectional views illustrating another substrate processing method according to the first embodiment.

Figure 7A:
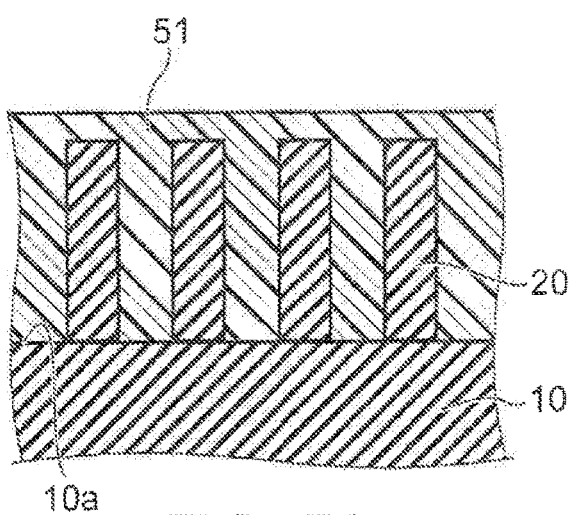
FIG. 7A to FIG. 7E are schematic cross-sectional views illustrating another substrate processing method according to the first embodiment.

As shown in FIG. 7A, a resist layer 51 is formed on the substrate 10 that is provided with a plurality of structural bodies 20. For example, a resist solution that will form the resist layer 51 is applied on the major surface 10a of the substrate 10 by, for example, a spinner, and pre-baked. In this way, the resist layer 51 is formed.

The resist layer 51 after pre-baking is irradiated with light via a mask (not illustrated on the drawings) having predetermined apertures.

Figure 7B:
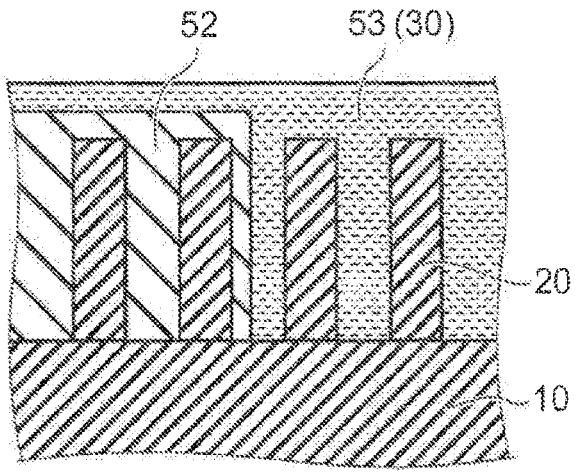

Then developing is carried out, as shown in FIG. 7B. That is, the substrate 10 is treated with a developing fluid 53. This developing fluid 53 is included in the liquid 30 according to the embodiment. When the resist layer 51 is a negative type, the portion that is not irradiated with light is removed by the developing fluid 53. When the resist layer 51 is a positive type, the portion that is irradiated with light is removed by the developing fluid 53. The remaining portion becomes a mask 52. The mask 52 covers a portion of the plurality of structural bodies 20, and is not provided on the other portion.

Figure 7C:
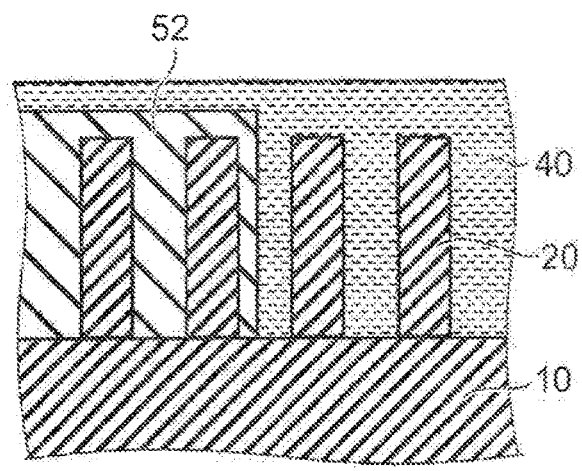

Then, as shown in FIG. 7C, the solution 40 is brought into contact with the structural bodies 20 that are wetted by the liquid 30 (for example, rinsing liquid after treating with the developing fluid 53, or the like). For example, after treating with the developing fluid 53, water cleaning, treating with a water soluble solvent, and treating with a non-aqueous solvent are carried out successively, and the solution 40 that will form the support member 45 is applied without drying.

Figure 7D:
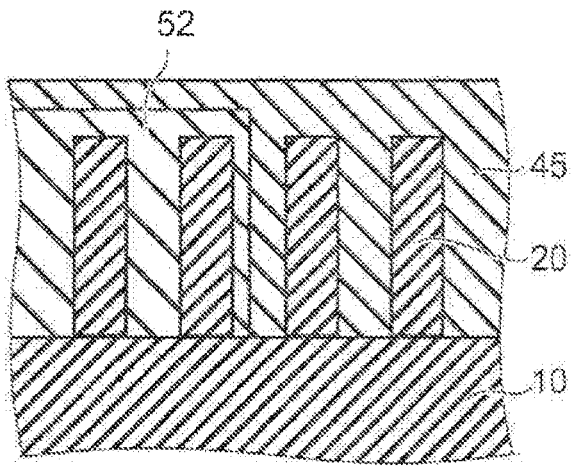
Figure 7E:
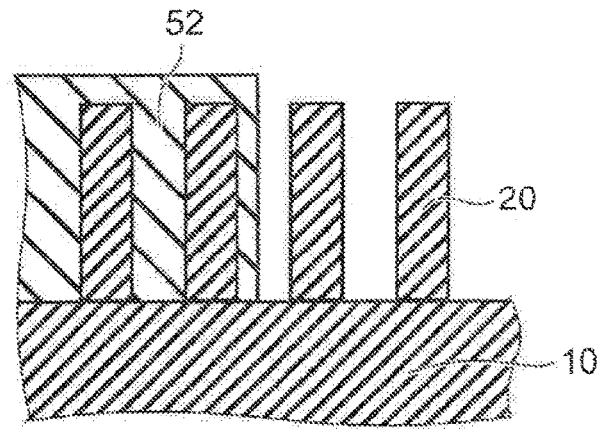

Then, as shown in FIG. 7D, at least a portion of the solution 40 is changed into a solid, to form the support member 45. Then, as shown in FIG. 7E, the support member 45 is changed from the solid phase to the gaseous phase, without passing through the liquid phase, and the support member 45 is removed. Then, if necessary, the mask 52 is baked and cured. At this time, baking process of the mask 52 and removing process of the support member 45 may be carried out at the same time.

Thereby, a configuration is formed in which a portion of the plurality of structural bodies 20 is covered by the mask 52, and other portion of the plurality of structural bodies 20 is exposed from the mask 52. For example, using the mask 52 as a mask, it is possible to selectively introduce impurities into predetermined regions of the major surface 10a of the substrate 10 by an ion implantation.

In this way, the embodiment can also be applied to a process of developing a resist formed on the structural bodies 20. That is, the substrate processing method according to the embodiment can further include a process of forming the resist layer 51 so that it covers the plurality of structural bodies 20 (the process illustrated in FIG. 7A), prior to treating the substrate 10 with the liquid 30.

The treating of the substrate 10 with the liquid 30 (Step S110, for example, the process shown in FIG. 7B) includes developing the resist layer 51, and removing at least a portion of the resist layer 51, The treating the substrate 10 with the liquid 30 can also include, for example, removing the resist layer 51 using stripping fluid that includes developing fluid or organic solvent or the like, or a mixture of sulfuric acid and hydrogen peroxide solution or the like, when reworking the resist layer 51 or the like. The forming of the support member 45 (Step S120, for example, the processes shown in FIG. 7C and FIG. 7D) can include forming the support member 45 so that the support member 45 supports the structural body 20 that was covered with the removed resist layer 51.

In this case also, a methacrylic resin material, a styrene resin material, or a fluorocarbon resin material (for example a material that includes a perfluoro group) can be used for the support member 45, A material from a material group that differs from the material group of the support member 45 can be used for the resist layer 51, The material of the resist layer 51 may or may not be photosensitive. Here, when a rework process as described above is performed, a re-formed resist layer may be formed as the support member 45 and the desired pattern can be formed. The support member 45 of this resist layer may be removed by changing from the solid phase to the gaseous phase without passing through the liquid phase, for example, by using an ashing. This process suppresses the pattern collapse as well.

FIG. 8A to FIG. 8E are schematic cross-sectional views illustrating another substrate processing method according to the first embodiment.

In this example, the embodiment is applied to an etching process using a liquid when forming a beam or the like separated from the substrate, in a process of manufacturing a MEMS device.

Figure 8A:
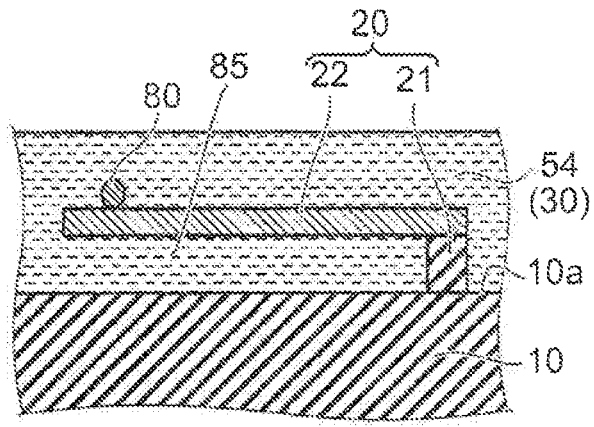
FIG. 8A to FIG. 8E are schematic cross-sectional views illustrating another substrate processing method according to the first embodiment.

As shown in FIG. 8A, a support pillar 21 is provided on the major surface of the substrate 10, and a beam 22 is provided on the support pillar 21 separated from the substrate 10. The support pillar 21 and the beam 22 are included in the structural body 20. A sacrificial layer (not illustrated on the drawings) is provided between the beam 22 and the substrate 10, and by removing this sacrificial layer the beam 22 is formed separated from the substrate 10, supported by the support pillar 21. In other words, a void 85 is formed between the beam 22 and the substrate 10.

FIG. 8A illustrates the process of removing the sacrificial layer with etching fluid 54. This treating the substrate 10 with the etching fluid 54 is a portion of the treating with the liquid 30. In this example, particle 80 such as etching residue or the like adheres to the structural body 20. The etching fluid 54 for etching the sacrificial layer for forming the void 85 is introduced to the sacrificial layer from a hole and/or a slit (not illustrated on the drawings) provided in the stacked body formed on the substrate 10.

Figure 8B:
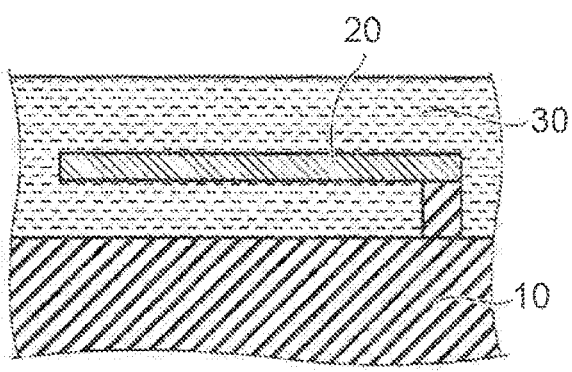

After the etching process, as shown in FIG. 8B, water cleaning and treating with water soluble solvent and non-aqueous solvent are carried out successively as treating with the liquid 30. In this way, the particle 80 is removed.

Figure 8C:
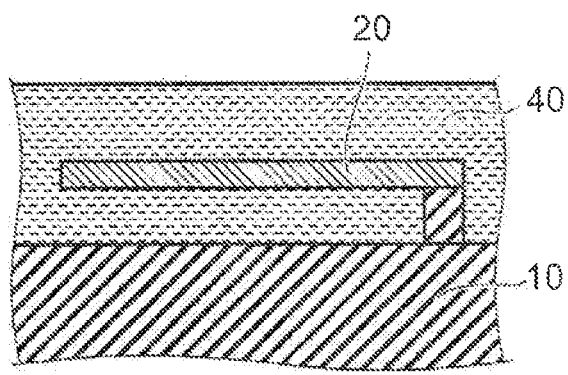
Figure 8D:
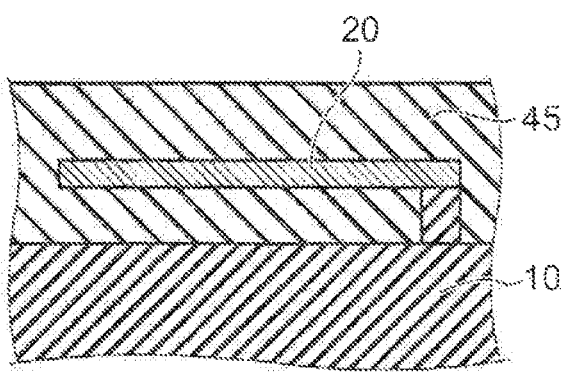
Figure 8E:
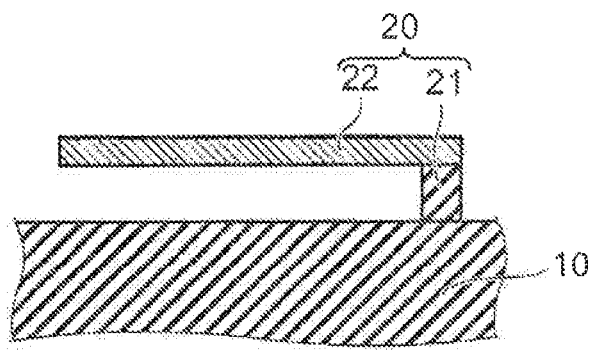

In addition, as shown in FIG. 8C, the structural body 20 wetted by the liquid 30 is brought into contact with a solution 40. Then, as shown in FIG. 8D, at least a portion of the solution 40 is changed into a solid, to form the support member 45. Then, as shown in FIG. 8E, the support member 45 is changed from the solid phase to the gaseous phase, without passing through the liquid phase, and the support member 45 is removed.

In this way, deformation of the beam 22, for example the beam 22 approaching or contacting the substrate 10, is suppressed.

For example, after the etching process shown in FIG. 8A, if the liquid 30 is directly dried, the surface tension of the liquid 30 will act between the beam 22 and the substrate 10, and the beam 22 will deform. Depending on the circumstances, the beam 22 may come closer to or contact the substrate 10.

In contrast, in the embodiment, after treating with the liquid 30, the liquid 30 is replaced with the solution 40, then the support member 45 is formed from the solution 40, and at least a part of the support member 45 is changed directly from the solid phase to the gaseous phase, without passing through the liquid phase. Thereby, as shown in FIG. 8E, it is possible to suppress pattern collapse when drying after liquid treatment.

In this way, in this example, the structural body 20 includes a portion (beam 22) separated from the major surface 10a of the substrate 10, and the support member 45 suppresses changes in the distance between the beam 22 and the substrate 10.

FIG. 9A to FIG. 9F are schematic cross-sectional views illustrating another substrate processing method according to the first embodiment.

Figure 9A:
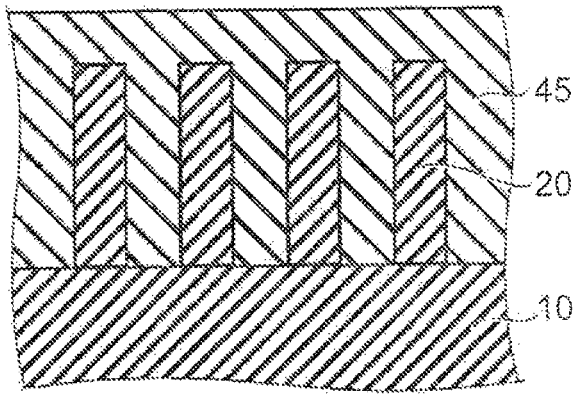
FIG. 9A to FIG. 9F are schematic cross-sectional views illustrating another substrate processing method according to the first embodiment.

As shown in FIG. 9A, the support member 45 is formed to support the structural bodies 20 on the substrate 10. Any of the methods already described can be used for this. In this example, as illustrated in FIG. 4A, the structural body 20 is substantially completely embedded in the support member 45. However, various changes can be made to the support member 45, as illustrated in FIG. 4B to FIG. 4D.

Figure 9B:
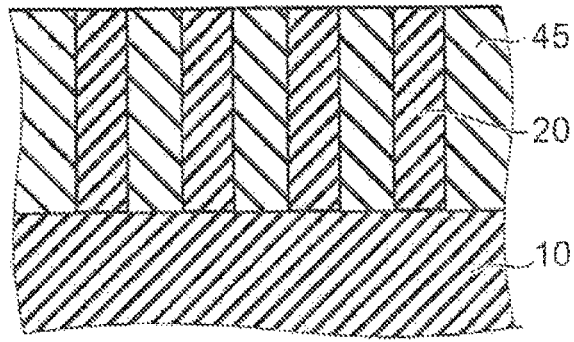
Figure 9C:
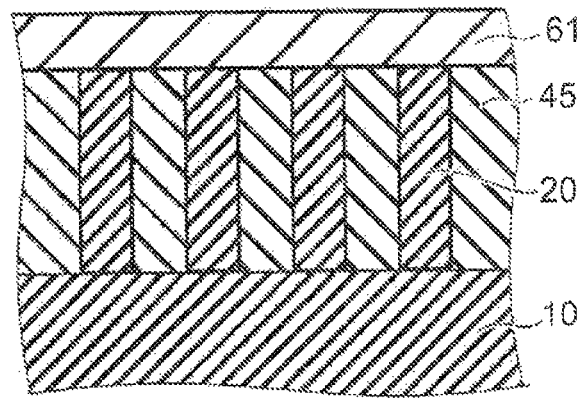

As shown in FIG. 9B, the support member 45 is etched back. Thereby, for example, the height of the support member 45 becomes almost the same as the height of the structural body 20, and the top surface of the structural body 20 is exposed. The structural body 20 may be exposed by CMP (Chemical Mechanical Polishing), RIE, or thermal processes such as annealing. As shown in FIG. 9C, an upper support film 61 is formed on the support member 45 and on the structural body 20. For example, an insulating film can be used as the upper support film 61. Here, the upper surface of the structural body 20 is not necessary to be exposed.

At least a boiling point of a material of the upper support film 61 is higher than a boiling point or a sublimation point of the support member 45. A melting point of the material of the upper support film 61 may be higher than a melting point or a sublimation point of the material of the support member 45. It is favorable that the upper support film 61 has a plurality opened pores (hereinafter referred to as "open pores"). A diameter of the open pores of the upper support film 61 is larger than a size of a gas molecule of sublimated support member 45. As described above, the gas molecule of the sublimated support member 45 has, for example, a C—C bond (0.14 nm) or a benzene ring (0.5 nm×1.2 nm). Therefore, the diameter of the open pores of the upper support film 61 is favorably 0.1 nm or more. The diameter of the open pores of the upper support film 61 is further favorably 1 nm or more. The upper support film 61 is, for example, a porous oxide silicon film or the like.

Figure 9D:
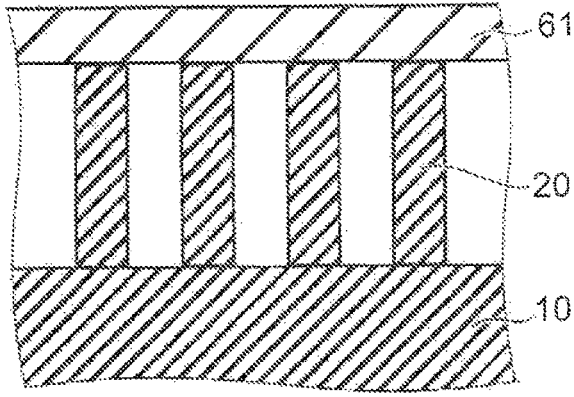

As shown in FIG. 9D, the support member 45 is removed while leaving the upper support film 61. For example, an opening (not illustrated on the drawings) is provided in the upper support film 61, and the support member 45 is removed via the opening. If a material having open pores is used in the upper support film 61, it is possible to remove the vaporized support member 45 through the open pores in the upper support film 61. Thereby, it is possible to remove the support member 45 without an opening.

At this time, heating is performed at a temperature not less than the boiling point or the sublimation point of the material of the support member 45 and less than the boiling point of the material of the upper support film 61. The heating is further favorably performed at a temperature not less than the boiling point or the sublimation point of the material of the support member 45 and less than a melting point of the material of the upper support film 61. This removes the support member 45 via the openings or the open pores in the upper support film 61 and leaves the upper support film 61 on the structural body 20. The heating temperature is, for example, not less than 200° C. and not more than 500° C. Removing the support member 45 can be performed using a pressure reduction process or an electron beam irradiation process other than the above, and combination of them may be acceptable.

Thereby, voids that are covered by the upper support film 61 are provided between structural bodies 20, and the top portions of the structural bodies 20 are supported by the upper support film 61. In other words, when there is an air gap structure between structural bodies 20, it is possible to dry the substrate 10 (structural bodies 20) while suppressing pattern collapse of the structural bodies 20. Thereafter, the upper support film 61 may be removed, or it may be left and used as an air gap structure. Forming the air gap structure does not always need a treating with the first liquid.

This method may be changed as follows.

Figure 9E:
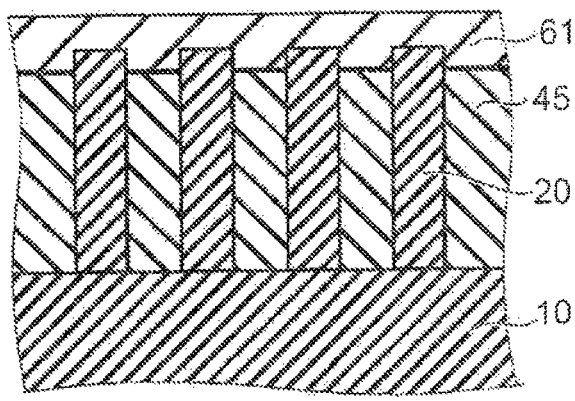
Figure 9F:
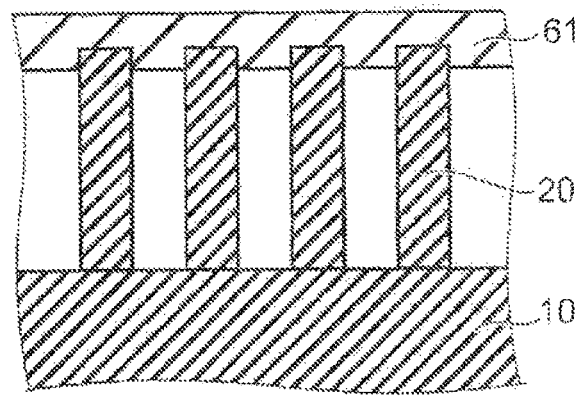

By etching back the support member 45 in the state illustrated in FIG. 9A, the height of the support member 45 is made lower than the height of the structural bodies 20, and the top portions of the structural bodies 20 are exposed. Then, as shown in FIG. 9E, the upper support film 61 is formed covering the exposed top portions of the structural bodies 20 and the support member 45. As shown in FIG. 9F, the support member 45 is removed while leaving the upper support film 61, Thereby, the side surfaces of the top portions and the top surfaces of the structural bodies 20 are supported by the upper support film 61. Thereafter, the upper support film 61 may be removed, or it may be left and used as an air gap structure.

In this way, by forming the upper support film 61 on the support member 45, collapse of the structural bodies 20 is more effectively suppressed.

Second Embodiment

The embodiment relates to a substrate processing apparatus that can carry out the substrate processing method described in connection with the first embodiment.

Figure 10:
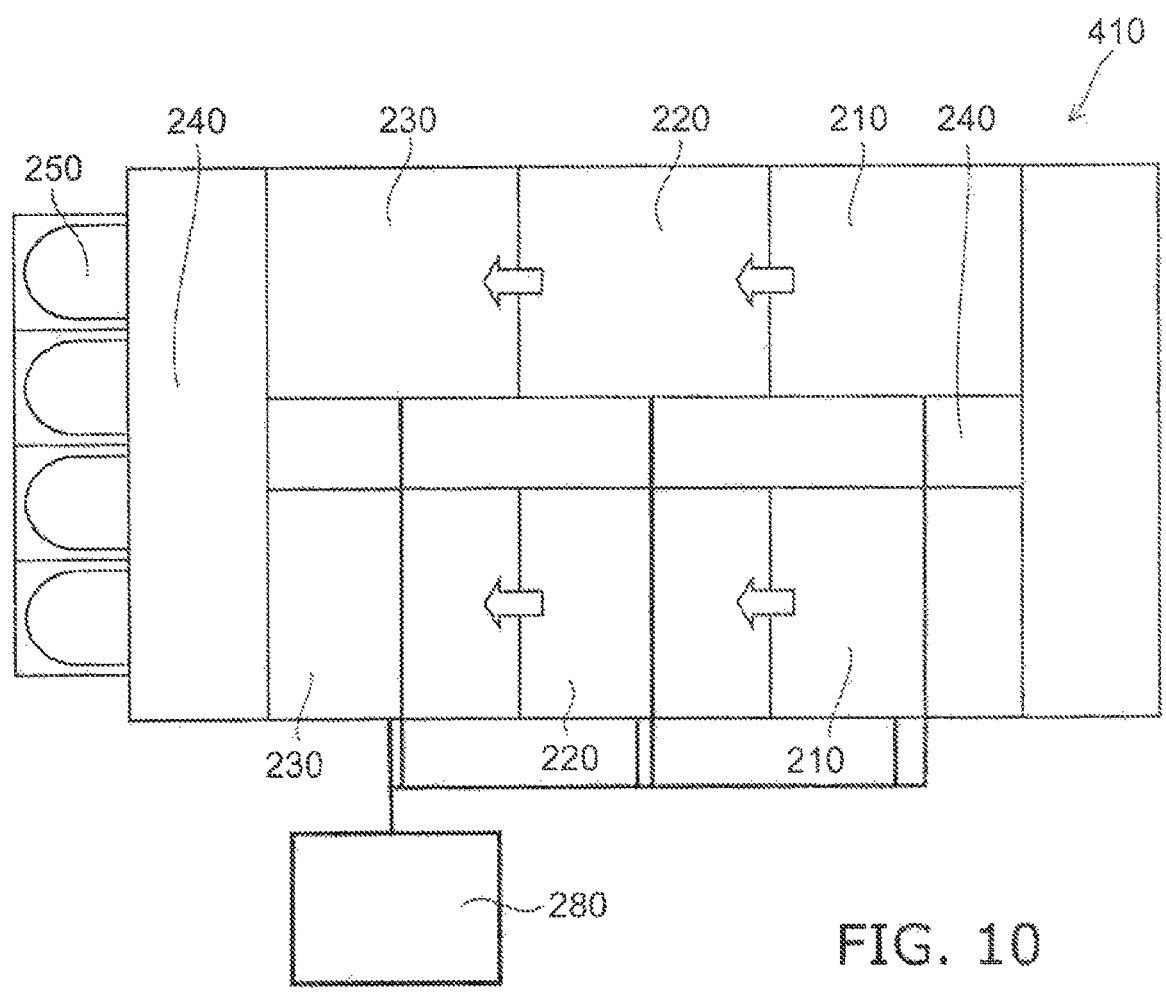
FIG. 10 is a schematic plan view illustrating a substrate processing apparatus according to the second embodiment.

FIG. 10 is a schematic plan view illustrating a substrate processing apparatus according to the second embodiment.

As shown in FIG. 10, a substrate processing apparatus 410 according to the embodiment includes a liquid treatment unit 210, a support member forming unit 220, a support member removing unit 230, and a control unit 280. The liquid treatment unit 210 is a unit that carries out treating the substrate 10 with the liquid 30. The support member forming unit 220 is a unit that forms the support member 45 that supports the structural body 20 on the substrate 10. The support member removing unit 230 is a unit that directly changes at least a part of the support member 45 from a solid phase to a gaseous phase and removes the support member 45. The control unit 280 controls these other units.

The substrate processing apparatus 410 further includes a substrate transport unit 240 (substrate transport robot), and a substrate storage unit 250 (load port). Using these, it is possible to efficiently carry out processing of a plurality of substrates 10.

After the substrate 10 has been treated in the liquid treatment unit 210, the substrate 10 is processed in the support member forming unit 220, and then processed in the support member removing unit 230. In this example, two of the set of the liquid treatment unit 210, the support member forming unit 220, and the support member removing unit 230 are provided, so processing of two systems can be carried out in parallel.

Figure 11:
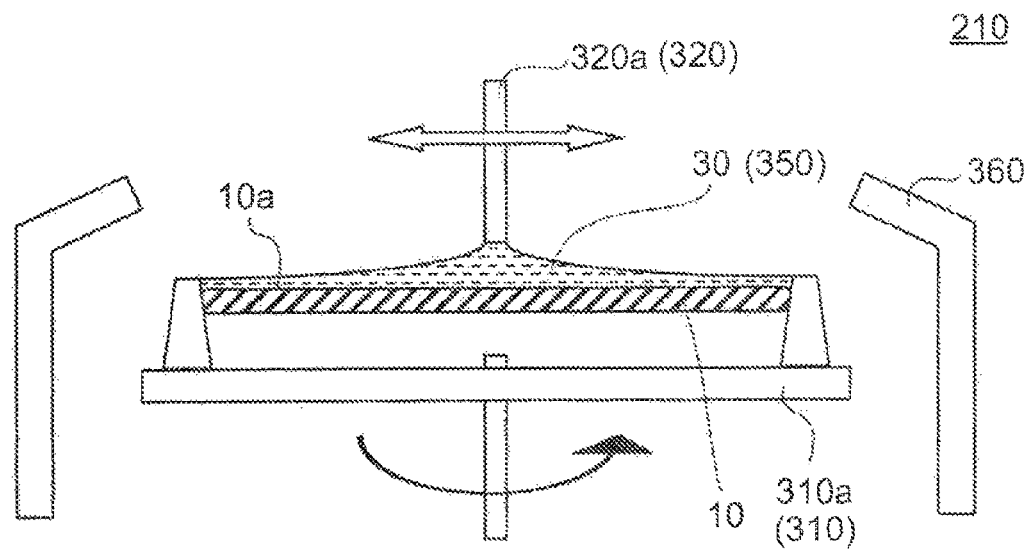
FIG. 11 is a schematic side view illustrating a portion of the substrate processing apparatus according to the second embodiment.

FIG. 11 is a schematic side view illustrating a portion of the substrate processing apparatus according to the second embodiment. This drawing illustrates one example of the liquid treatment unit 210.

As shown in FIG. 11, the liquid treatment unit 210 of the substrate processing apparatus 410 is provided with a holding unit 310a and a supplying unit 320a. The holding unit 310a holds the substrate 10. A structural body 20 (omitted on this drawing) is provided on the major surface 10a of the substrate 10. A stage that can turn is used as the holding unit 310a. The supplying unit 320a supplies the liquid 30 that is the first liquid as a liquid substance 350 onto the major surface 10a of the substrate 10. The supplying unit 320a includes, for example, a nozzle that can supply chemicals. In this example, a cover 360 is provided around the holding unit 310a. The cover 360 prevents the chemicals from being scattered into the surroundings. Using the holding unit 310a and the supplying unit 320a, it is possible to carry out the treating the substrate 10 with the liquid 30, i.e. the first liquid (Step S110), as described in connection with the first embodiment.

At least one of the holding unit 310a and the supplying unit 320a can move relatively within planes parallel to the major surface 10a of the substrate 10.

Figure 12:
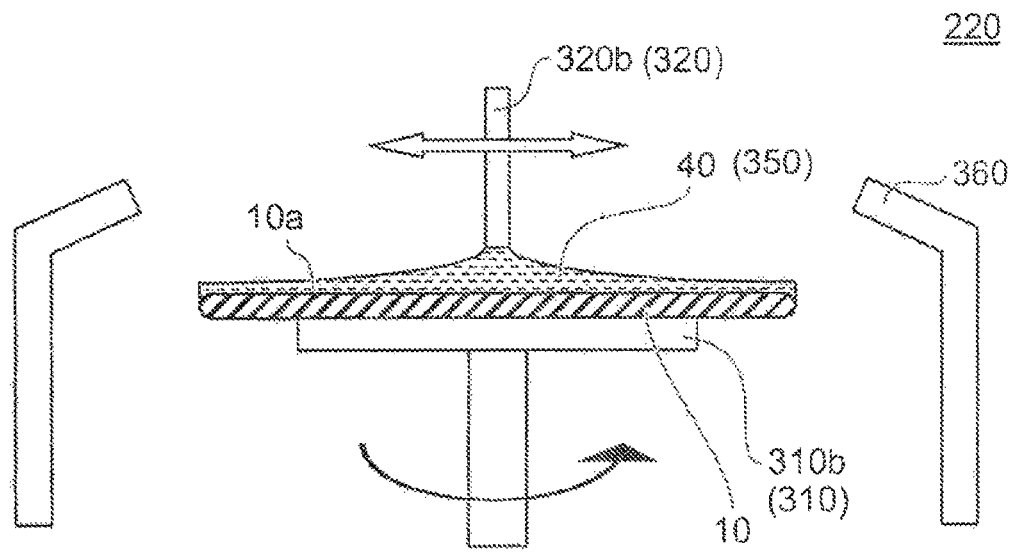
FIG. 12 is a schematic side view illustrating a portion of the substrate processing apparatus according to the second embodiment.

FIG. 12 is a schematic side view illustrating a portion of the substrate processing apparatus according to the second embodiment. This drawing illustrates one example of the support member forming unit 220.

As shown in FIG. 12, a holding unit 310b and a supplying unit 320b are provided in the support member forming unit 220 of the substrate processing apparatus 410. The holding unit 310b holds the substrate 10. The supplying unit 320b supplies the solution 40 that is the second liquid as a liquid substance 350 onto the major surface 10a of the substrate 10. In this example, the cover 360 is provided around the holding unit 310b. Using the holding unit 310b and the supplying unit 320b, it is possible to bring the solution 40 into contact with the structural body 20 that is wetted by the liquid 30, as described in connection with the first embodiment. Then, it is possible to carry out the process of forming the support member 45 by changing at least a portion of the solution 40 into a solid (Step S120). In this case, a mechanism for removing the support member 45 formed on an unwanted part such as a substrate periphery or a back surface may be provided.

At least one of the holding unit 310b and the supplying unit 320b can move relatively within planes parallel to the major surface 10a of the substrate 10.

Figure 13:
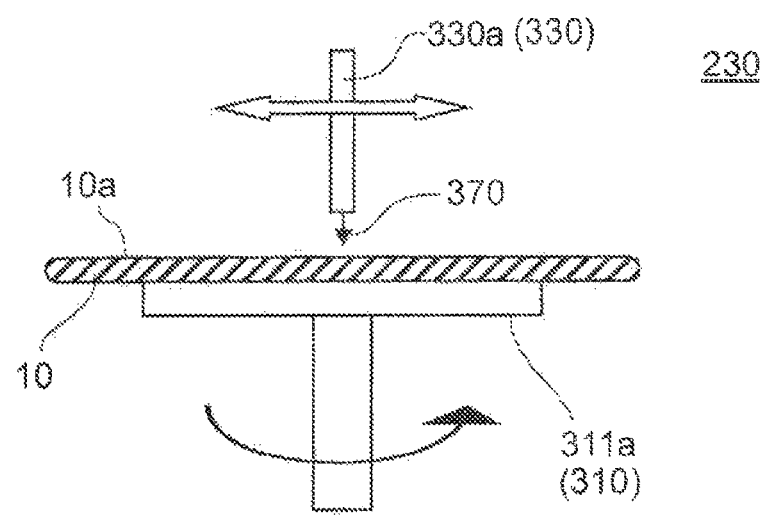
FIG. 13 is a schematic side view illustrating a portion of the substrate processing apparatus according to the second embodiment.

FIG. 13 is a schematic side view illustrating a portion of the substrate processing apparatus according to the second embodiment. This drawing illustrates one example of the support member removing unit 230.

As shown in FIG. 13, the support member removing unit 230 of the substrate processing apparatus 410 is provided with a holding unit 311a and a processing unit 330a. The holding unit 311a holds the substrate 10. The processing unit 330a carries out at least one of the processes of heating, light irradiation, electron beam irradiation, pressure reduction, and gas supply. In this example the processing unit 330a carries out heating. In this example, the processing unit 330a includes a nozzle that blows a high temperature gas 370 or the like onto the major surface 10a of the substrate 10. Thereby, the substrate 10 is heated, and at least a part of the support member 45 is directly changed from the solid phase to the gaseous phase, and the support member 45 is removed.

At least one of the holding unit 311a and the processing unit 330a can move relatively within planes parallel to the major surface 10a of the substrate 10.

Figure 14:
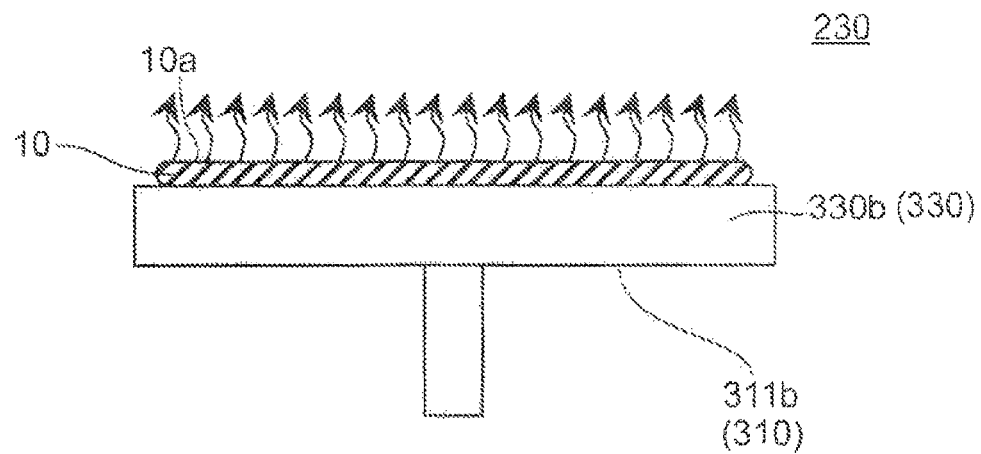
FIG. 14 is a schematic side view illustrating a portion of the substrate processing apparatus according to the second embodiment.

FIG. 14 is a schematic side view illustrating a portion of the substrate processing apparatus according to the second embodiment. This drawing illustrates another example of the support member removing unit 230.

As shown in FIG. 14, the support member removing unit 230 is provided with a holding unit 311b and a processing unit 330b. The holding unit 311b holds the substrate 10. In this example, a heater is used as the processing unit 330b. The heater is provided within the holding unit 311b, or on the top surface portion of the holding unit 311b. Using the processing unit 330b, the substrate 10 is heated, and at least a part of the support member 45 is directly changed from the solid phase to the gaseous phase, and the support member 45 is removed.

Figure 15:
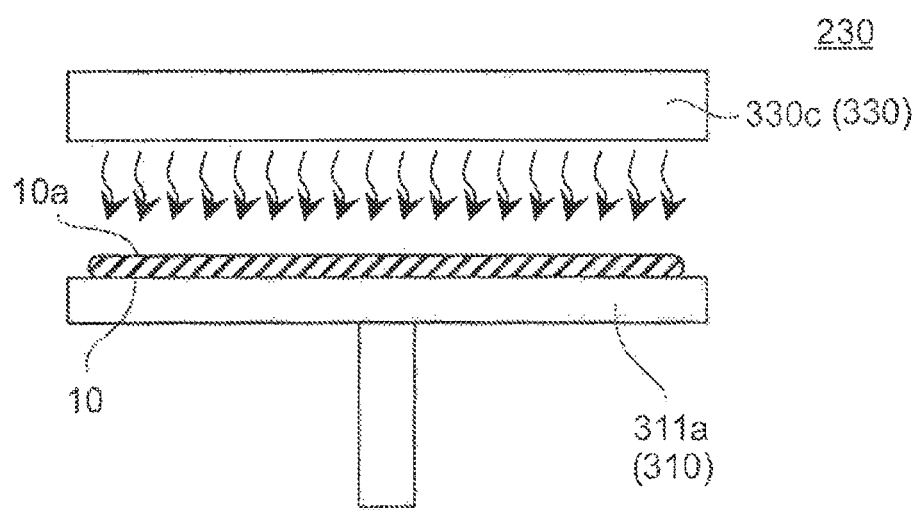
FIG. 15 is a schematic side view illustrating a portion of the substrate processing apparatus according to the second embodiment.

FIG. 15 is a schematic side view illustrating a portion of the substrate processing apparatus according to the second embodiment. This drawing illustrates yet another example of the support member removing unit 230.

As shown in FIG. 15, the support member removing unit 230 is provided with the holding unit 311a and a processing unit 330c. In this example, a heater, a lamp, an electron beam irradiation device, or the like is used as the processing unit 330c. The processing unit 330c is installed above the holding unit 311a to oppose the substrate 10 that is supported by the holding unit 311a. Using the processing unit 330c, the substrate 10 is heated, irradiated with light, irradiated with an electron beam, or the like, and at least a part of the support member 45 is directly changed from the solid phase to the gaseous phase, and the support member 45 is removed.

Figure 16:
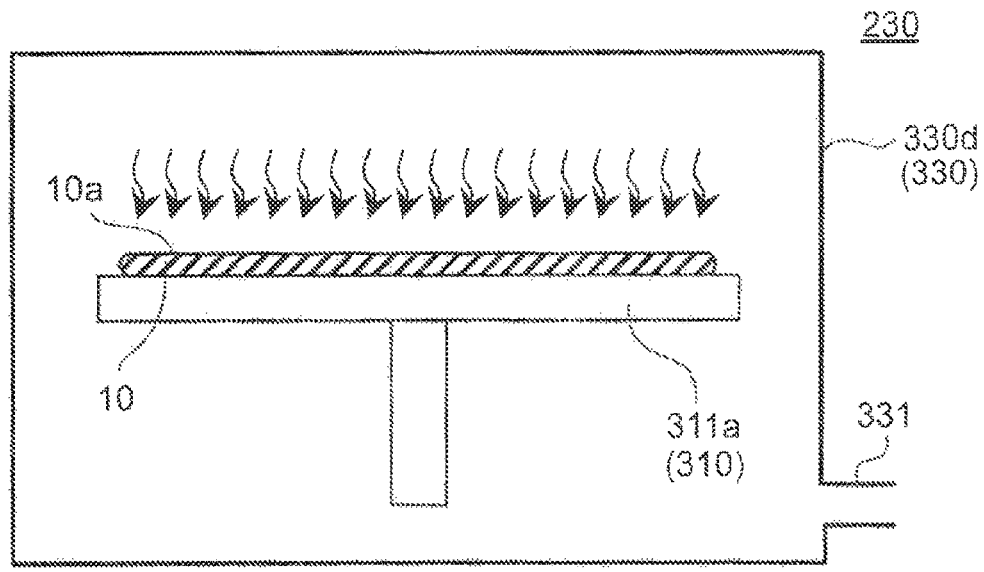
FIG. 16 is a schematic side view illustrating a portion of the substrate processing apparatus according to the second embodiment.

FIG. 16 is a schematic side view illustrating a portion of the substrate processing apparatus according to the second embodiment. This drawing illustrates yet another example of the support member removing unit 230.

As shown in FIG. 16, the support member removing unit 230 is provided with the holding unit 311a and a processing unit 330d. In this example, a chamber in which the pressure can be reduced is used as the processing unit 330d. A pump is connected to a gas evacuation port 331 of the processing unit 330d. The holding unit 311a is provided within the processing unit 330d, so the surroundings of the substrate 10 are in a pressure reduced state. Thereby, a pressure reduction process is carried out on the substrate 10, and at least a part of the support member 45 is directly changed from the solid phase to the gaseous phase, and the support member 45 is removed.

Figure 17:
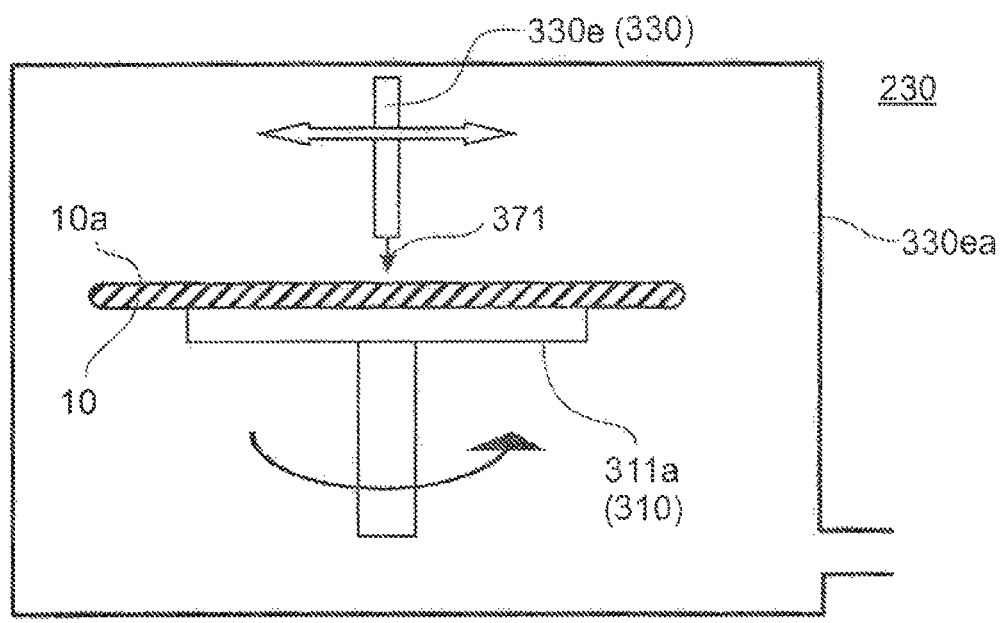
FIG. 17 is a schematic side view illustrating a portion of the substrate processing apparatus according to the second embodiment.

FIG. 17 is a schematic side view illustrating a portion of the substrate processing apparatus according to the second embodiment. This drawing illustrates yet another example of the support member removing unit 230.

As shown in FIG. 17, the support member removing unit 230 is provided with the holding unit 311a and a processing unit 330e. In this example, the processing unit 330e includes a nozzle that supplies a gas that reacts with the support member 45 (reactive gas 371). In this example, the holding unit 311a and the processing unit 330e are provided within a processing chamber 330ea. By supplying the reactive gas 371 from the processing unit 330e onto the substrate 10, at least a part of the support member 45 is directly changed from the solid phase to the gaseous phase, and the support member 45 is removed.

In this way, with various configurations, the support member removing unit 230 carries out the process of removing at least a part of the support member 45 by changing the support member 45 from the solid phase to the gaseous phase, without passing through the liquid phase (Step S130). The support member 45 may be removed using a plurality of methods, without being limited to one method.

The control unit 280 illustrated in FIG. 10 carries out these processes as a series of operations.

That is, the substrate processing apparatus 410 according to the embodiment includes a holding unit 310 (the holding unit 310a, 310b, 311a, 311b, and so on), a supplying unit 320 (the supplying unit 320a, 320b, and so on), and a processing unit 330 (the processing unit 330a, 330b, 330c, 330d, 330e, and so on). The holding unit 310 holds the substrate 10. For example, the structural body 20 is formed on the major surface 10a of the substrate 10. The supplying unit 320 supplies the liquid substance 350 (the liquid 30 or the solution 40 and so on) onto the major surface 10a of the substrate 10. The processing unit 330 carries out at least one of the processes of heating, light irradiation, electron beam irradiation, pressure reduction, and gas supply on the substrate 10.

The control unit 280 controls the holding unit 310, the supplying unit 320, and the processing unit 330. The control unit 280 make the holding unit 310, the supplying unit 320, and the processing unit 330 to carry out the series of operations of treating the substrate 10 with the liquid 30 (Step S110); the process of forming the support member 45 that supports the structural body 20 provided on the substrate 10, by bringing the solution 40 into contact with the substrate 10 that is wetted by the liquid 30, and changing at least a portion of the solution 40 into a solid by carrying out at least one of causing the solution 40 to react, reducing the quantity of a solvent included in the solution 40 and causing at least a portion of the substance dissolved in the solvent from the solution 40 to be separated (Step S120); and the process of removing at least a part of the support member 45 by changing the support member 45 from the solid phase to the gaseous phase without passing through the liquid phase (Step S130).

Thus, it is possible to provide a substrate processing apparatus that suppresses pattern collapse when drying after treating with liquid.

Figure 18:
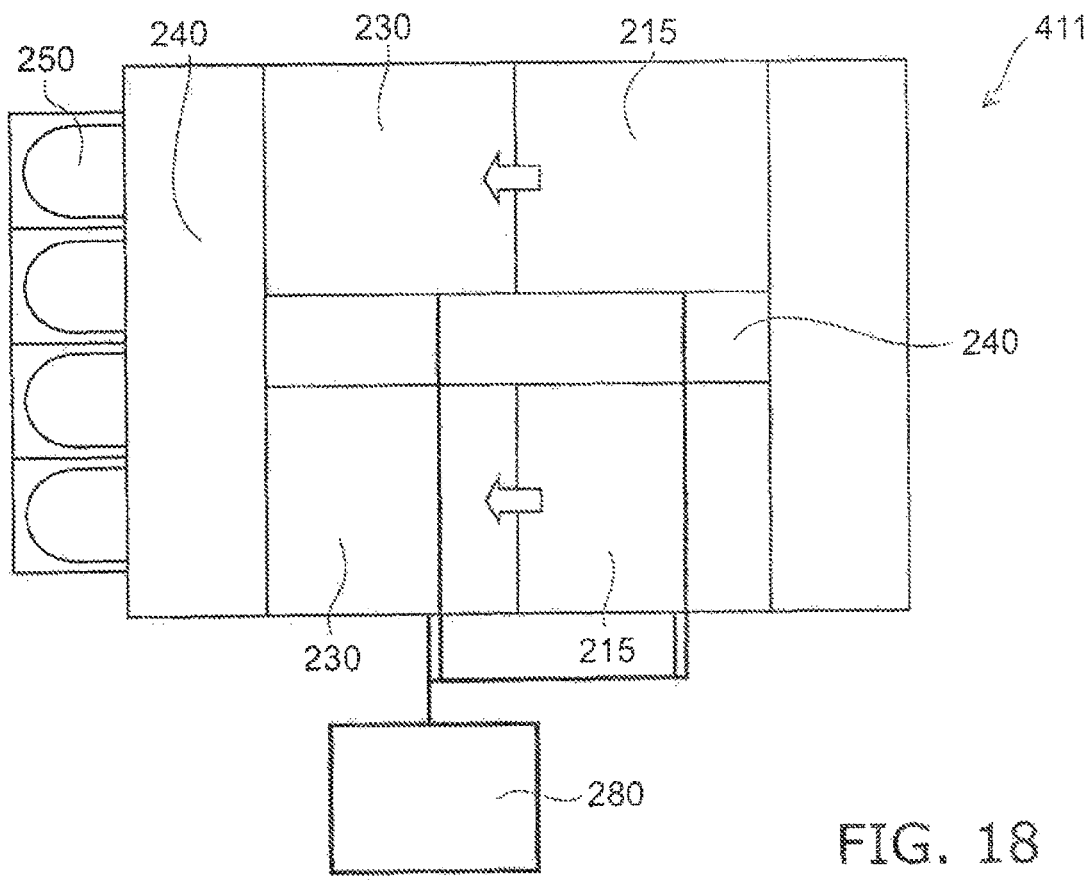
FIG. 18 is a schematic plan view illustrating another substrate processing apparatus according to the second embodiment.

FIG. 18 is a schematic plan view illustrating another substrate processing apparatus according to the second embodiment.

As shown in FIG. 18, another substrate processing apparatus 411 according to the embodiment includes a liquid treating and support member forming unit 215, the support member removing unit 230, and the control unit 280, The liquid treating and support member forming unit 215 includes the functions of the liquid processing unit 210 and the support member forming unit 220.

After the substrate 10 has been processed in the liquid treating and support member forming unit 215, the substrate 10 is processed in the support member removing unit 230. In this example, two of the set of the liquid treating and support member forming unit 215 and the support member removing unit 230 are provided, so processing of two systems can be carried out in parallel.

Figure 19:
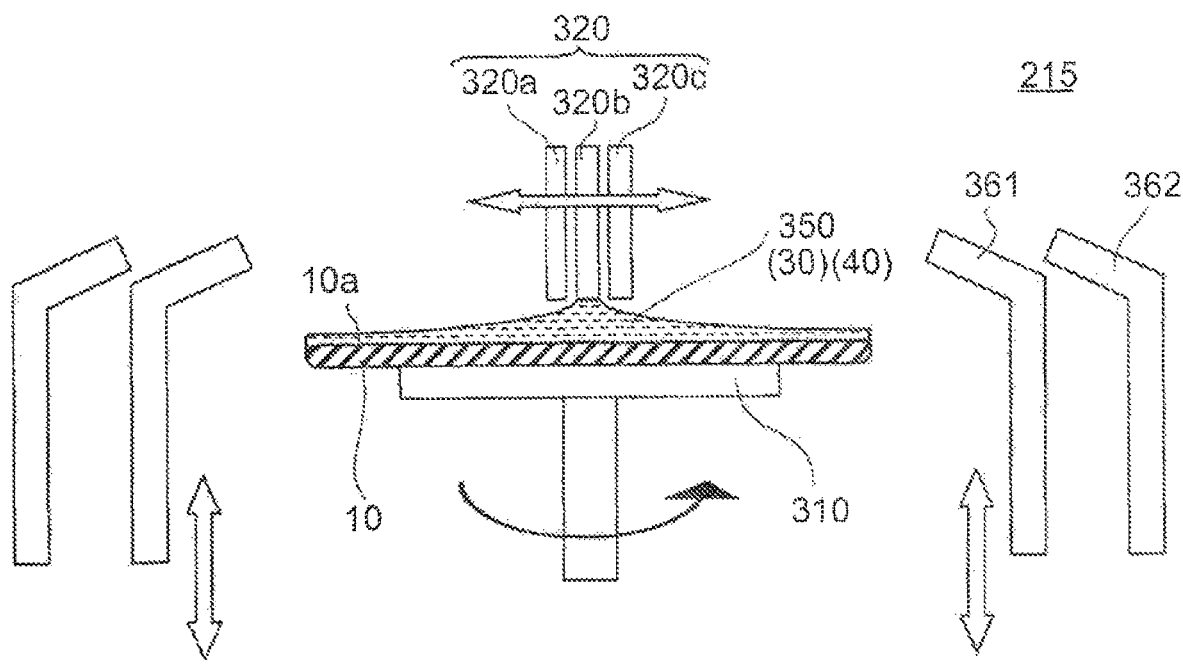
FIG. 19 is a schematic side view illustrating a portion of the substrate processing apparatus according to the second embodiment.

FIG. 19 is a schematic side view illustrating a portion of the substrate processing apparatus according to the second embodiment. This drawing shows one example of the liquid treating and support member forming unit 215.

As shown in FIG. 19, the holding unit 310 and the supplying unit 320 are provided in the liquid treating and support member forming unit 215 of the substrate processing apparatus 411. The holding unit 310 holds the substrate 10. A plurality of nozzles (the supplying unit 320a, 320b, 320c, and so on) is provided as the supplying unit 320. Thus, different types of liquid substance 350 (for example, the liquid 30 and the solution 40 and so on) can be supplied onto the major surface 10a of the substrate 10. For example, chemical and rinsing fluid that are a portion of the liquid 30, and the solution 40 that will become the support member 45, and so on, can each be supplied from different nozzles. Thereby, at least one of the Step S110 and the Step S120 can be carried out. For example, Step S110 and Step S120 can be carried out continuously.

In this example, depending on the type of process to be carried out, the gap between the holding unit 310 and each of the plurality of supplying units 320 can be changed. In this example, a plurality of covers 361 and 362 and so on is provided around the holding unit 310a. Each of the plurality of covers 361 and 362 can move relatively vertically or the like depending on the type of process to be carried out.

At least one of the holding unit 310 and the supplying unit 320 can move relatively within planes parallel to the major surface 10a of the substrate 10.

In this example, the supplying unit 320 supplies the liquid substance 350 along the vertical direction from above the substrate 10 towards the substrate 10.

Figure 20:
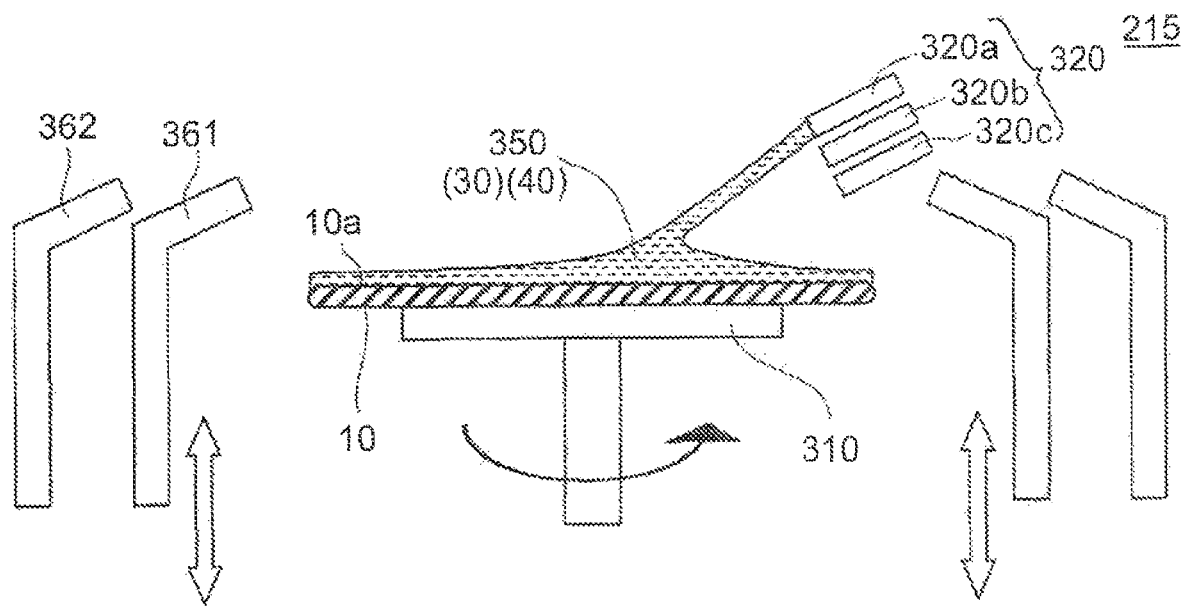
FIG. 20 is a schematic side view illustrating a portion of the substrate processing apparatus according to the second embodiment.

FIG. 20 is a schematic side view illustrating a portion of the substrate processing apparatus according to the second embodiment. This drawing shows another example of the liquid treating and support member forming unit 215.

As shown in FIG. 20, in this example a plurality of nozzles that corresponding the supplying unit 320 (supplying unit 320a, 320b, 320c, and so on) supplies the liquid substance 350 onto the substrate 10 along an oblique direction towards the major surface 10a of the substrate 10. Thereby, the form of supply of the liquid substance 350 can be changed in various ways.

Figure 21:
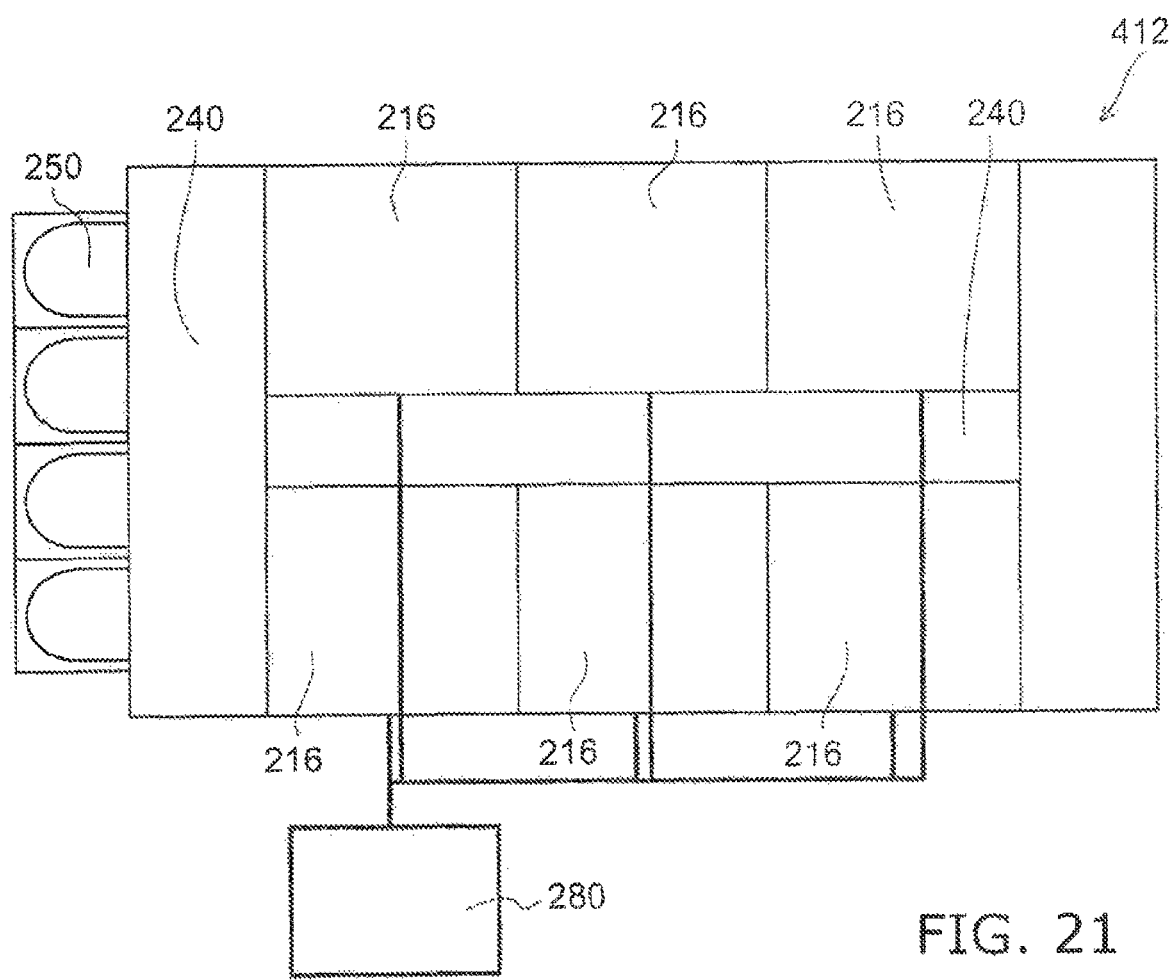
FIG. 21 is a schematic plan view illustrating another substrate processing apparatus according to the second embodiment.

FIG. 21 is a schematic plan view illustrating another substrate processing apparatus according to the second embodiment.

As shown in FIG. 21, another substrate processing apparatus 412 according to the embodiment includes a liquid treating and support member forming and removing unit 216, and the control unit 280. The liquid treating and support member forming and removing unit 216 has the three functions of the liquid processing unit 210, the support member forming unit 220, and the support member removing unit 230.

In this example, Step S110, Step S120, and Step S130 are carried out in the single liquid treating and support member forming and removing unit 216. In this example, six liquid treating and support member forming and removing units 216 are provided. Thereby, processing of six systems can be carried out in parallel.

In the liquid treating and support member forming and removing unit 216, for example the holding unit 310, the supplying unit 320 illustrated in FIG. 19 and FIG. 20, and the processing unit 330 illustrated in FIG. 13 to FIG. 17 are provided in the same processing chamber. Thus, processes of Step S110, Step S120, and Step S130 can be easily carried out as a series of operations.

In the substrate processing apparatus according to the embodiment, a substrate transport unit 240 can transfer a substrate treated with a liquid 30 from a liquid treatment unit 210 to a support member forming unit 220 without drying the substrate.

In the substrate processing apparatus according to the embodiment, for example, when vaporizing the solvent in order to form the support member 45, a solvent vaporizing unit may be provided between the unit supplying the solution that will become the support member and the support member removing unit. For example, the solvent is heated using a heater or a hot plate to be vaporized.

In the substrate processing apparatus according to the embodiment, a single wafer processing or a batch processing can be applied. One of the single wafer processing and the batch processing may be applied to one of a plurality of processes, and another of the single wafer processing or the batch processing may be applied to one other of the plurality of processes. For example, the single wafer processing may be applied to the step S120 for forming the support member 45 and the batch processing may be applied to the step 130 for removing the support member 45.

According to the embodiment, a substrate processing method and substrate processing apparatus that suppresses pattern collapse when drying after treating with liquid is provided.

In the specification of the application, "vertical" and "parallel" refer to not only strictly vertical and strictly parallel but also include, for example, the fluctuation due to manufacturing processes, etc. It is sufficient to be substantially vertical and substantially parallel. If the desired process is possible, "vertical" and "parallel" are not always necessary.

Embodiments of the invention with reference to examples were described above. However, the embodiments of the invention are not limited to these examples. For example, if a person with ordinary skill in the art to which this invention pertains carries out the invention in the same way by selecting the specific configurations of the substrate, the structural body, the liquid, the solution, and the support member used in the substrate processing method, and the holding unit, the supplying unit, the processing unit, the control unit, the liquid treatment unit, the support member forming unit, the support member removing unit, the liquid treating and support member forming unit, and the liquid treating and support member forming and removing unit, and so on as appropriate from the publicly known scope and can obtain the same results, then it is included within the scope of the invention.

Further, any two or more components of the specific examples may be combined within the extent of technical feasibility and are included in the scope of the invention to the extent that the purport of the invention is included.

Beside such cases, all substrate processing methods and substrate processing apparatuses based on the substrate processing method and substrate processing apparatus described above as embodiments of the invention, that are obtainable through appropriate design modifications by a person skilled in the art shall be understood to fall within the scope of the invention, provided they do not depart from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit; and removing the solid member from a solid phase directly to a gaseous phase, the solid member being removed using sublimation by heating, wherein:

a plurality of the structural bodies are provided on the major surface of the substrate, and the solid member covers at least a portion of each of the structural bodies, and the forming the solid member includes forming the solid member so that a space partially remains in the solid member between the structural bodies.

2. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit;

removing the solid member from a solid phase directly to a gaseous phase, the solid member being removed using sublimation by heating; and treating the substrate with a third liquid after the forming the solid member before the removing the solid member, the third liquid having lower surface tension than a surface tension of water, a contact angle of the solid member with respect to the third liquid being higher than a contact angle of the structural body with respect to the third liquid.

3. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit;

removing the solid member from a solid phase directly to a gaseous phase, the solid member being removed using sublimation by heating; and forming an upper film over the solid member, wherein a plurality of the structural bodies are provided on the major surface of the substrate, and the upper support film is provided on the solid member and the structural bodies, the removing the solid member includes providing a space between the structural bodies by removing the solid member while leaving the upper film.

4. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit; and removing the solid member from a solid phase directly to a gaseous phase, the solid member being removed using sublimation by heating, wherein the changing the at least the portion of the second liquid into the solid includes plating.

5. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit; and removing the solid member from a solid phase directly to a gaseous phase, the solid member being removed using sublimation by heating, wherein the forming the solid member includes making at least one of a gap and a depression.

6. A substrate processing method by using a substrate processing apparatus provided with a holding unit and a processing unit, comprising:

treating at least a major surface side of a substrate with a first liquid, a structural body being provided on the major surface of the substrate, the structural body having a top surface, a side surface and a bottom surface, the bottom surface contacting the major surface of the substrate;

bringing a second liquid into contact with the structural body and the substrate, the second liquid being not a rinsing liquid;

forming a solid member by changing at least a portion of the second liquid into a solid, the solid member being formed to be in contact with at least the side surface of the structural body and to prevent the structural body from collapse when drying after the liquid treatment by the second liquid, the changing at least the portion of the second liquid into the solid including at least one of a pressure application process, a spin drying process, a gas supply drying process, or a natural drying process;

providing the substrate provided with the solid member on the holding unit;

blowing a gas onto the major surface of the substrate for heating the substrate by using a nozzle provided with the processing unit; and removing the solid member from a solid phase directly to a gaseous phase, the solid member being removed using sublimation by heating, wherein the forming the solid member includes making a lower portion of the structural body and making an upper portion of the structural body on the lower portion and a part of the upper portion is apart from the lower portion.

* * * * *